United States Patent
Cheng et al.

(10) Patent No.: US 9,917,006 B1
(45) Date of Patent: Mar. 13, 2018

(54) METHOD OF PLANARIZATING FILM

(71) Applicant: Taiwan Semiconductor Manufacturing Co., Ltd., Hsin-Chu (TW)

(72) Inventors: Chihy-Yuan Cheng, Tainan (TW); Chun-Chang Wu, Nantou County (TW); Shun-Shing Yang, Tainan (TW); Ching-Sen Kuo, Taipei (TW); Feng-Jia Shiu, Hsinchu County (TW); Chun-Chang Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/260,555

(22) Filed: Sep. 9, 2016

(51) Int. Cl.
*H01L 27/00* (2006.01)
*H01L 21/765* (2006.01)
*H01L 29/06* (2006.01)
*H01L 27/088* (2006.01)

(52) U.S. Cl.
CPC ........ *H01L 21/765* (2013.01); *H01L 27/0886* (2013.01); *H01L 29/0619* (2013.01)

(58) Field of Classification Search
CPC .......... H01L 21/765; H01L 27/0886; H01L 29/0619

USPC ................ 257/401, 529, E21.579, E23.149; 365/148

See application file for complete search history.

(56) References Cited

U.S. PATENT DOCUMENTS

| | | | |
|---|---|---|---|
| 8,869,436 B2 | 10/2014 | Tsai et al. | |
| 2005/0189612 A1* | 9/2005 | Hung | H01L 21/76807 257/529 |
| 2013/0234094 A1 | 9/2013 | Chang et al. | |
| 2013/0336041 A1 | 12/2013 | Tsai et al. | |
| 2014/0146593 A1 | 5/2014 | Tsai et al. | |
| 2014/0166961 A1 | 6/2014 | Liao et al. | |
| 2014/0175365 A1 | 6/2014 | Chang et al. | |
| 2014/0203236 A1 | 7/2014 | Chen et al. | |
| 2014/0264222 A1 | 9/2014 | Yang et al. | |
| 2014/0264233 A1 | 9/2014 | Tu et al. | |

* cited by examiner

*Primary Examiner* — Bo Fan
(74) *Attorney, Agent, or Firm* — Haynes and Boone, LLP

(57) ABSTRACT

A method includes forming a patterned layer on a substrate having a first region and a second region being adjacent each other. The patterned layer includes first features in the first region. The second region is free of the patterned layer. The method further includes forming a material layer on the patterned layer and the substrate; forming a first guard ring disposed in the second region and surrounding the first features; forming a flowable-material (FM) layer over the material layer; forming a patterned resist layer over the FM layer, wherein the patterned resist layer includes a plurality of openings; and transferring the plurality of openings to the material layer.

20 Claims, 40 Drawing Sheets

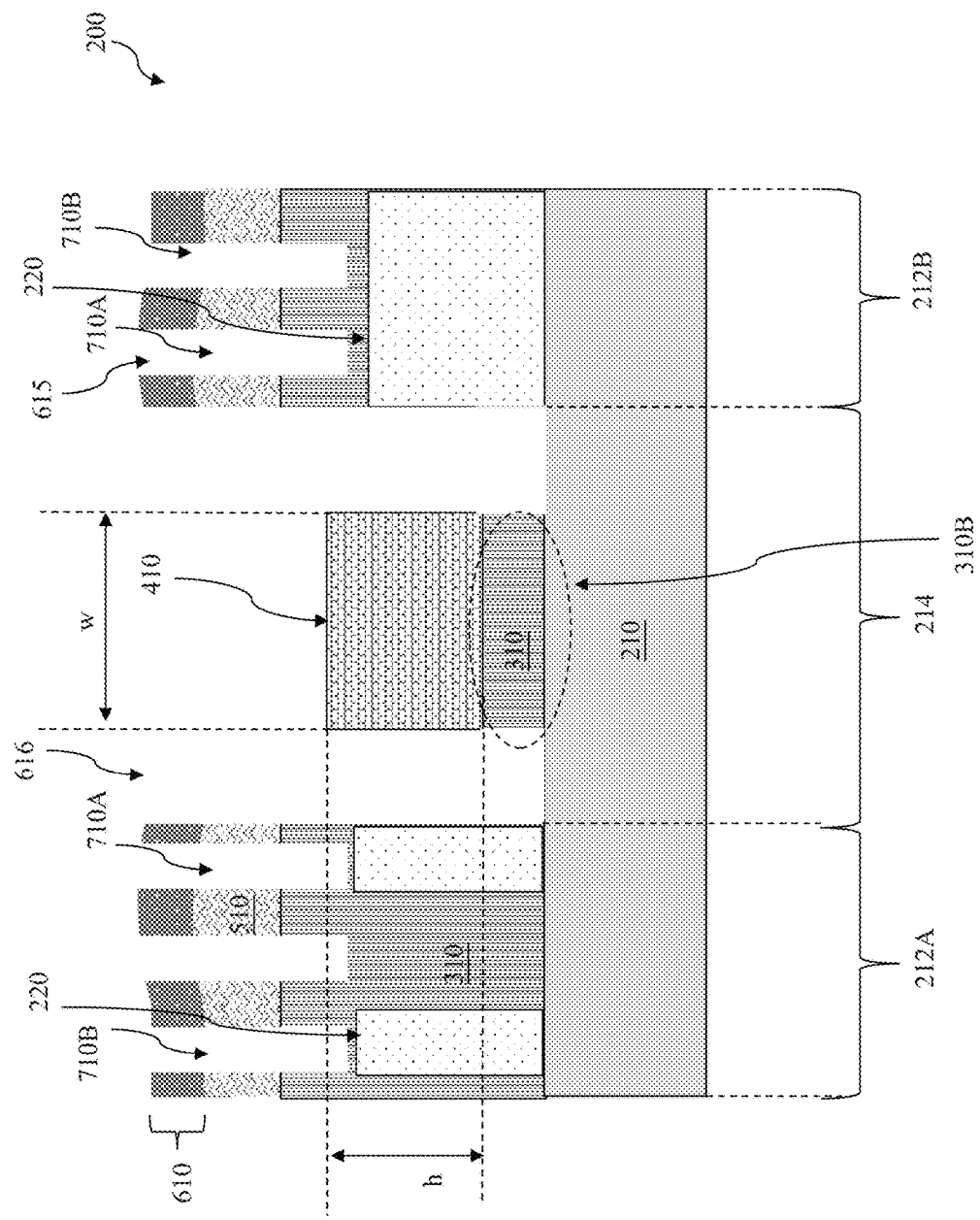

METHOD OF PLANARIZATING FILM

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, due to uneven top surface, existing lithography patterning process may generate with degraded critical dimension (CD) uniformity. Therefore there is a need for a semiconductor structure and the method making the same to the various issues, such as CD uniformity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 21, 22, 23, 24A, 24B, 25A and 25B are cross-sectional views of an example semiconductor device in accordance with some embodiments.

DETAILED DESCRIPTION

Figure 1:
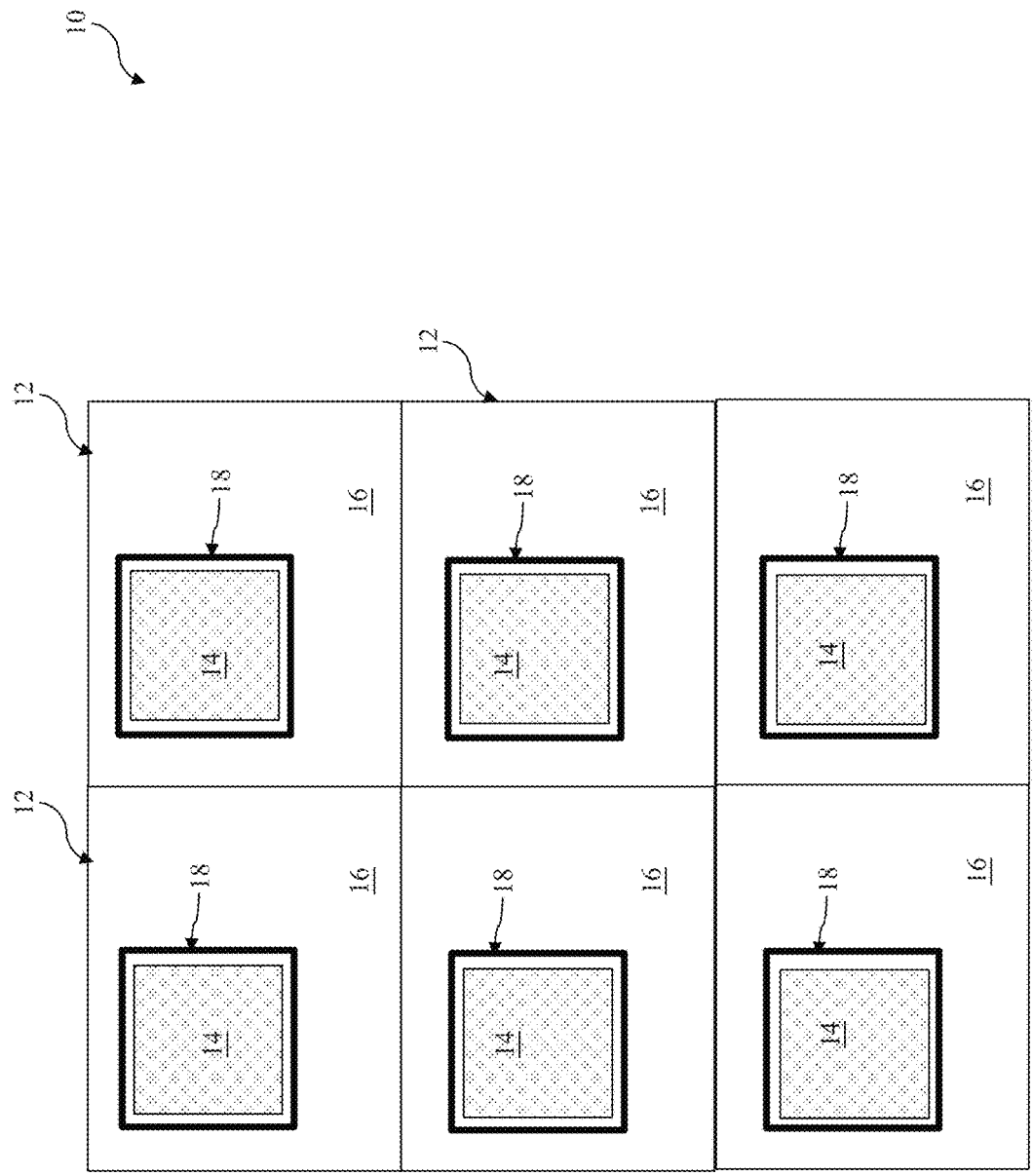
FIG. 1 is a top view of a workpiece constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
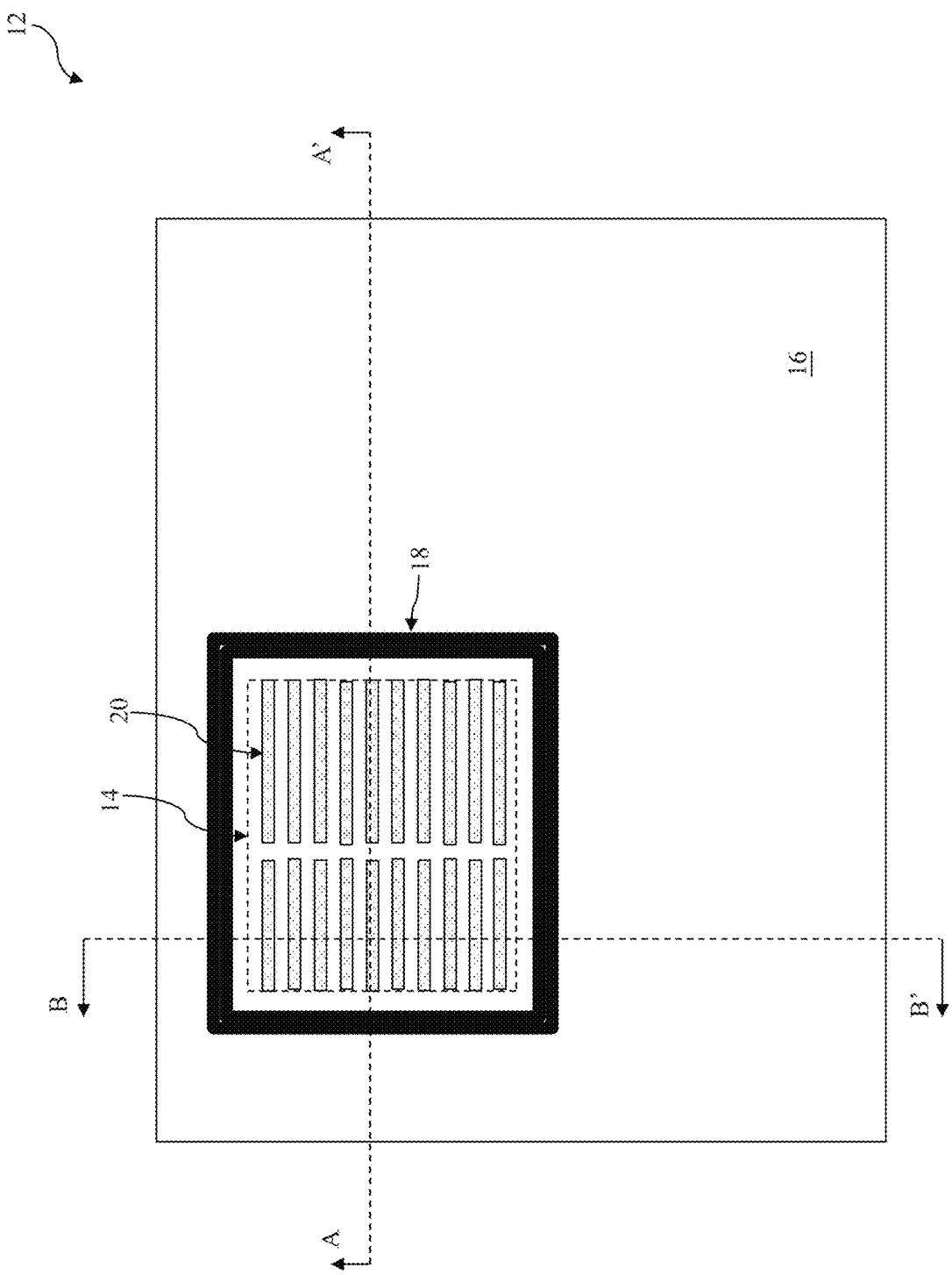
FIG. 2 is a top view of a semiconductor structure constructed in accordance with some embodiments.
Figure 3:
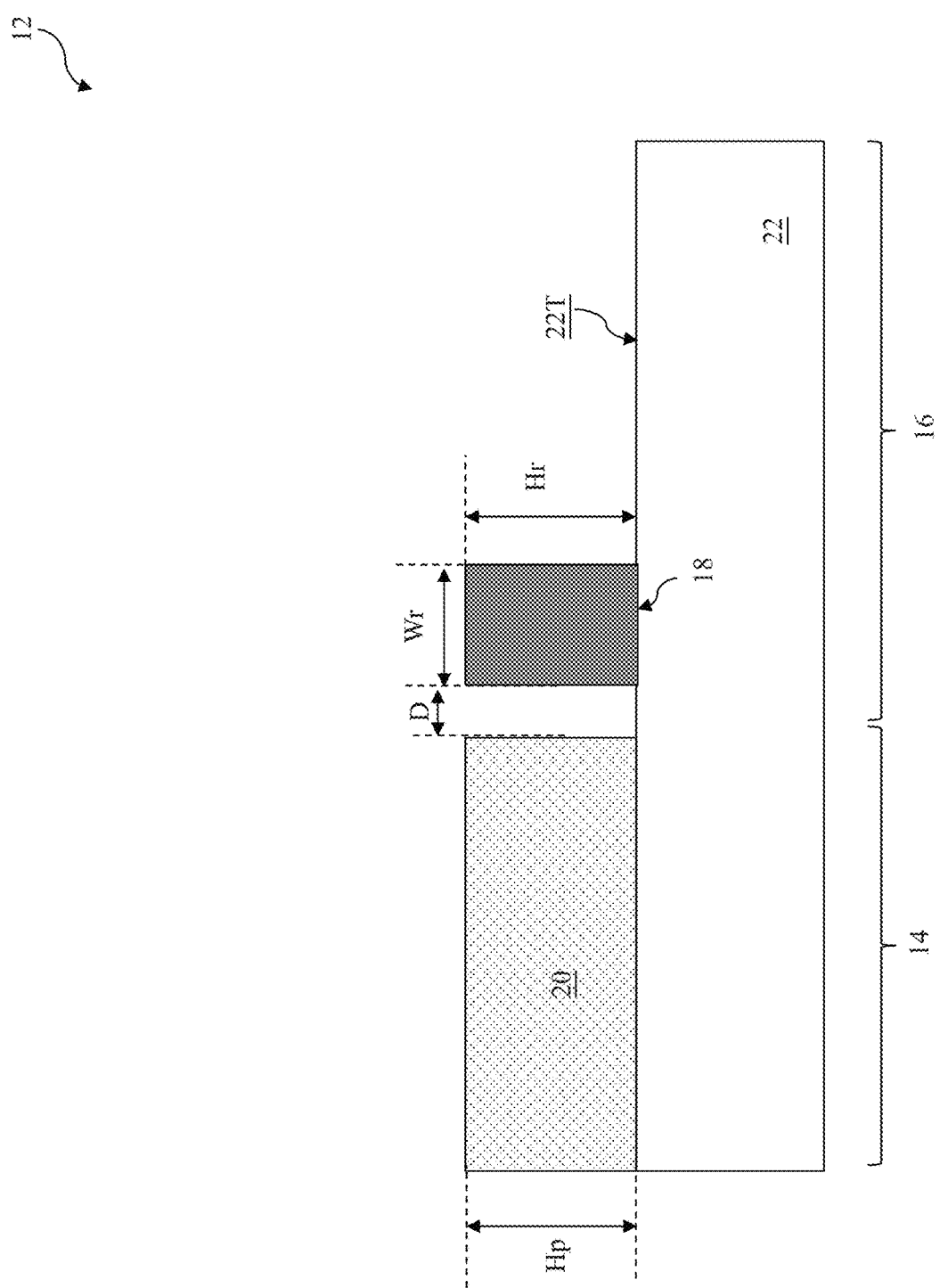
FIG. 3 is a sectional view of the semiconductor structure in FIG. 2 constructed in accordance with some embodiments.

FIG. 1 is a top view of a workpiece 10, in portion, in accordance with some embodiments. FIG. 2 is a top view of a semiconductor structure 12 (a portion of the workpiece 10) in accordance with some embodiments. FIG. 3 is a sectional view of the semiconductor structure 12, along the dashed line AA', in accordance with some embodiments. The workpiece 10, the semiconductor structure 12 and the method making the same are collectively described with reference to FIGS. 1-3 and other figures.

Referring to FIG. 1, the workpiece 10 is a semiconductor wafer in fabrication, in accordance with some embodiments. The workpiece 10 includes various patterns formed thereon and other patterns to be formed thereon. For example, the workpiece 10 is a silicon wafer, other semiconductor wafer or other suitable wafer used to form integrated circuits thereon.

The workpiece 10 includes a plurality of integrated circuits (referred to as semiconductor structure) 12 to be cut into separate integrated circuit (IC) chips after the completion of the IC fabrication. Each IC chip may be further tested and packaged to a functional integrated circuit according to respective application. The semiconductor structure 12 includes a first region 14 and a second region 16 adjacent the first region 14. Furthermore, the semiconductor structure 12 includes a pattern layer having a plurality of circuit features 20 disposed within the first region 14 and being absent in the second region 16.

A guard ring structure 18 is disposed in the second region 16 and configured to surround the plurality of circuit features 20 within the first region 14. The guard ring structure 18 is a continuous structure configured to enclose the circuit features 20 within the first region 14. In the present embodiment, the guard ring structure 18 has a continuous structure and various dimensions designed to effectively constrain a flowing material during the fabrication stage such that to provide fabrication advantages. In some embodiments, the guard ring structure 18 is spaced a distance D from the first circuit features 20 and is designed to have a width Wr. In furtherance of the embodiments, Wr is greater than D. In some examples, the guard ring structure is designed to have the ratio Wr/D greater than 5. In some examples, the guard ring 18 is designed to have a height Hr, the circuit features 20 have a height Hp that is substantially equal to Hr. In the present example, the circuit features 20 and the guard ring structure 18 have respective bottom surfaces being coplanar with each other. As illustrated in FIG. 3, the substrate 22 has a planarized top surface 22T. The circuit features 20 and the guard ring structure 18 are disposed on the planarized surface 20A.

Figure 6:
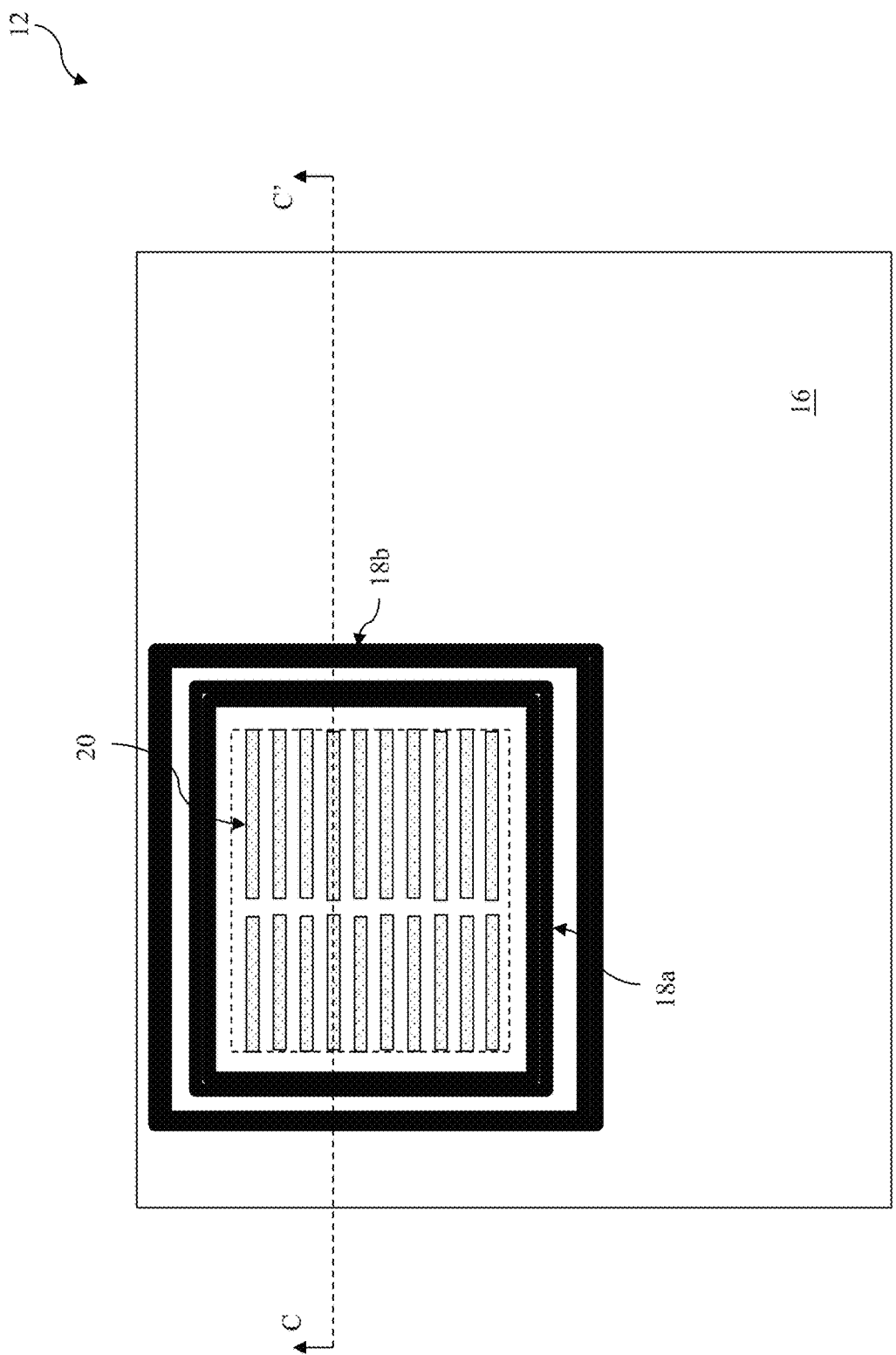
FIG. 6 is a top view of a semiconductor structure constructed in accordance with some embodiments.
Figure 7:
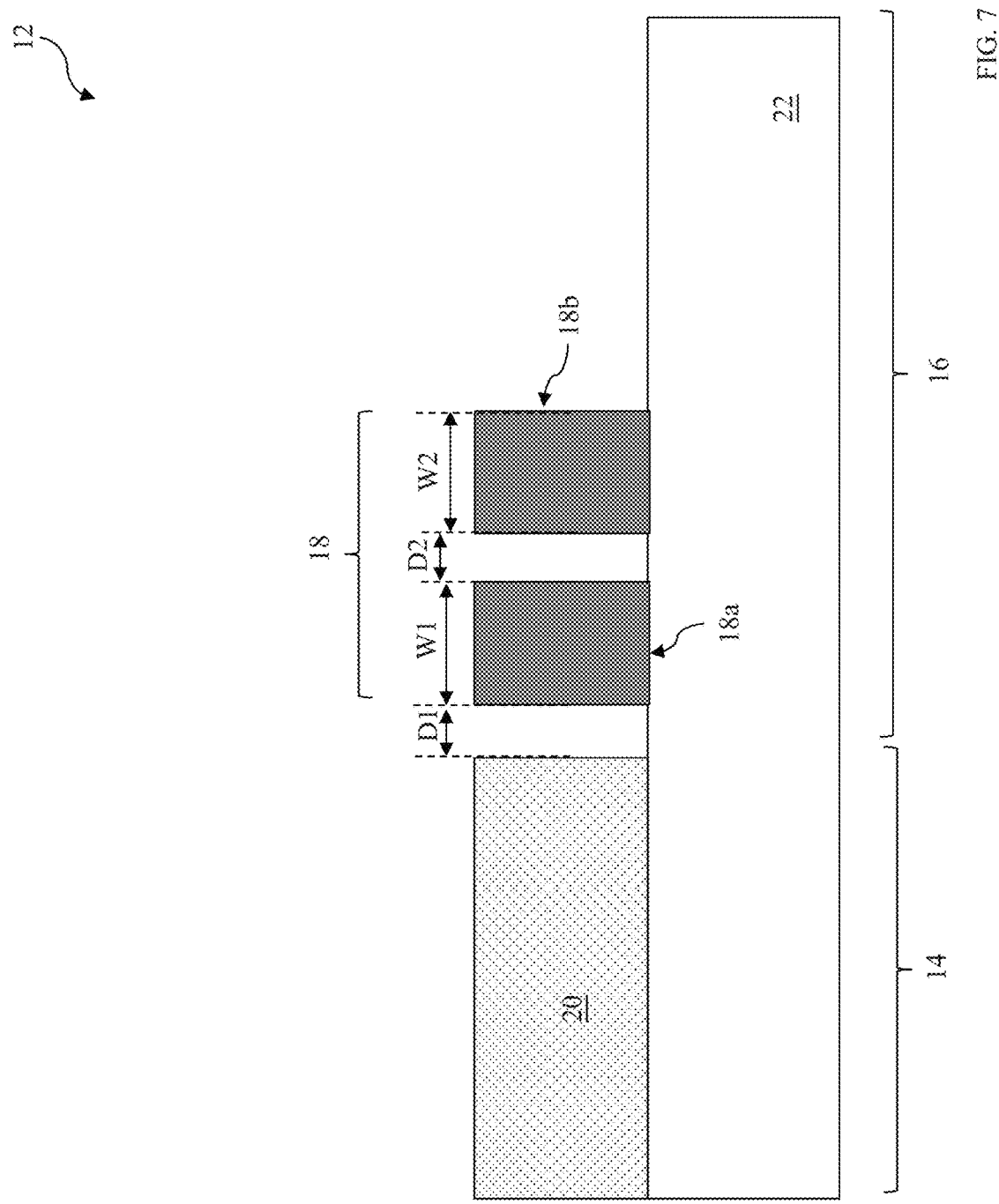
FIG. 7 is a sectional view of the semiconductor structure in FIG. 6 constructed in accordance with some embodiments.

In some embodiments, the guard ring structure 18 includes two or more continuous guard rings, such as one illustrated in FIG. 6 in a top view and FIG. 7 in a sectional view, along the dashed line CC', of the semiconductor structure 12 in accordance with some embodiments. In FIGS. 6 and 7, the semiconductor structure 12 includes a guard ring structure 18 having a first guard ring 18a and a second guard ring 18b. Similarly, the first guard ring 18a is spaced a distance D1 from the first circuit features 20 and is designed to have a width W1. In furtherance of the embodiments, W1 is greater than D1. In some examples, the first guard ring 18a is designed to have the ratio W1/D1 greater than 5. The second guard ring 18b is spaced a distance D2 from the first guard ring 18a and is designed to have a width W2. In furtherance of the embodiments, W2 is greater than D2; W1 and W2 are substantially equal; and D2 is less than D1. In some examples, the second guard ring 18b is designed to have the ratio W2/D2 greater than 5.

Figure 8:
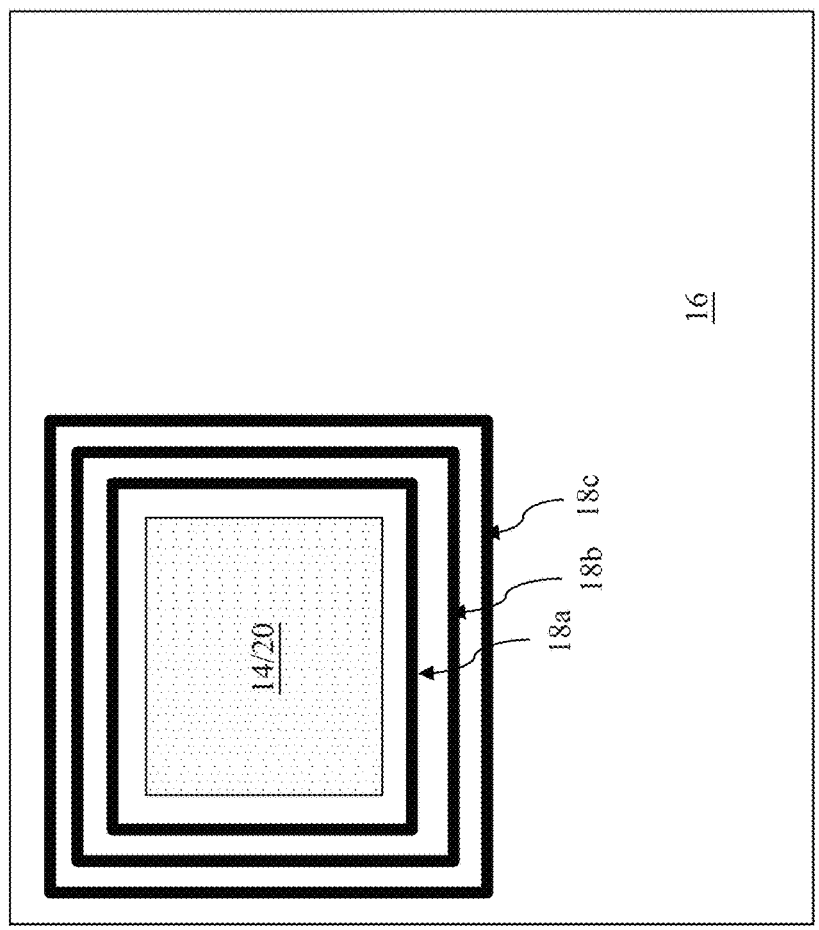
FIGS. 8, 9 and 10 are top views of a semiconductor structure constructed in accordance with various embodiments.

In some embodiments, as illustrated in FIG. 8, the semiconductor structure 12 includes circuit features 20 in the first region 14 and the guard ring structure 18 having three continuous guard rings 18a, 18b and 18c configured to surround the circuit features 20 in the first region 14. Each guard ring has a continuous feature to enclose the circuit features 20 inside, when viewed in the top view. Particularly, the second ring 18b is configured to surround the first guard ring 18a and the third ring 18c is configured to surround the second guard ring 18b. The three guard rings are designed to have the dimensions and gaps similar to the guard ring structure 12 in FIG. 2 or in FIG. 6. In the present embodiments, the first guard ring 18a is spaced a distance D1 from the first circuit features 20 and is designed to have a width W1, wherein W1 is greater than D1. In some examples, the ratio W1/D1 is greater than 5. The second guard ring 18b is spaced a distance D2 from the first guard ring 18a and is designed to have a width W2, wherein W2 is greater than D2; W1 and W2 are substantially equal; and D2 is less than D1. In some examples, the ratio W2/D2 is greater than 5. Similarly, The third guard ring 18c is spaced a distance D3 from the second guard ring 18b and is designed to have a width W3, wherein W3 is greater than D3; W2 and W3 are substantially equal; and D3 is less than D2. In some examples, the ratio W3/D3 is greater than 5.

In the present embodiment, the first region 14 and the second region 16 are designed and configured to have different functional circuits or devices. For example, the first region 14 is designed for memory devices, such as non-volatile memory cells; and the second region 16 is designed for logic devices. The corresponding circuits in the first and second regions are designed with respective considerations and are fabricated in different procedures. In some examples, the first region 14 is configured for the non-volatile memory cells and the circuit features 20 in the first region 14 are fin active regions designed for the non-volatile memory cells to be formed thereon.

Figure 9:
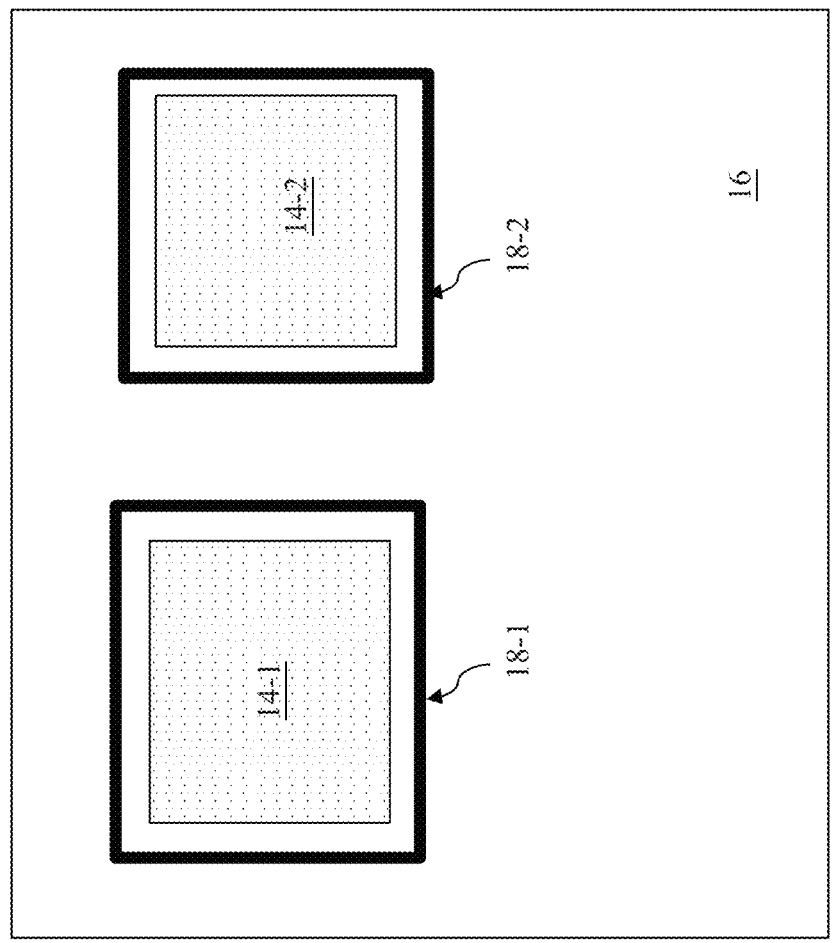
Figure 10:
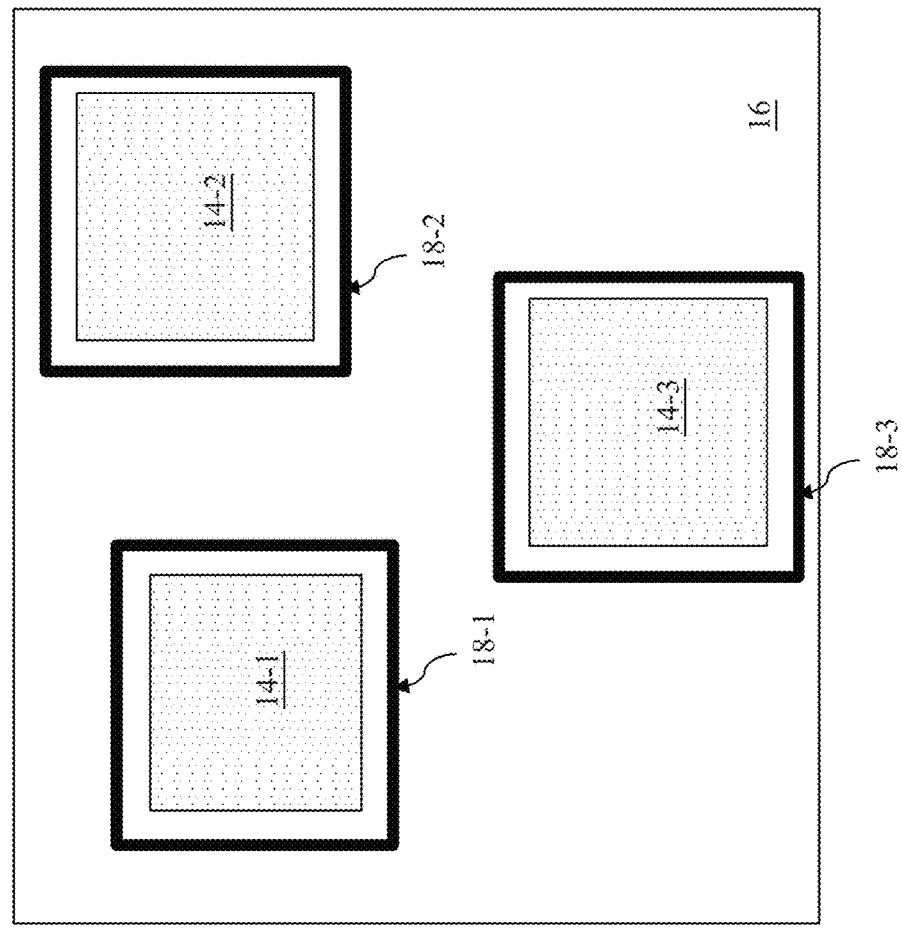

In some embodiments, as illustrated in FIG. 9, the semiconductor structure 12 may include two or more first regions, such as first regions 14-1 and 14-2, designed and configured for the non-volatile memory cells. In some other examples, the different first regions are designed for different memory devices, such as the first region 14-1 for non-volatile memory cells and the first region 14-2 for static random access memory cells. The guard ring structure is designed to have respective guard rings to enclose the corresponding first regions. For example, a first guard ring structure 18-1 is configured in the second region 16 and is designed to surround the first region 14-1 and a second guard ring structure 18-2 is configured in the second region 16 and is designed to surround the first region 14-2. Each guard ring structure is designed to have gaps and dimensions similar those in FIG. 2, 6 or 8. For example, the first guard ring structure 18-1 includes a continuous guard ring to enclose the circuit features 20 in the first region 14-1. The first guard ring structure 18-1 is spaced a distance D1 from the corresponding circuit features 20 and is designed to have a width W1, wherein W1 is greater than D1. In some examples, the ratio W1/D1 is greater than 5. The first guard ring structure 18-1 may include two or more guard rings, such as those in FIGS. 6 and 8. The second guard ring structure 18-2 is designed similarly as the first guard ring structure 18-1 in terms of configuration and dimensions. For example, the second guard ring structure 18-2 includes a continuous guard ring being spaced a distance D from the corresponding circuit features 20 in the first region 14-2 and is designed to have a width W, wherein W is greater than D. In some examples, the ratio W/D is greater than 5. FIG. 10 is a top view of the semiconductor structure 12 in accordance with some other embodiments. The semiconductor structure 12 includes three first regions, such as first regions 14-1, 14-2 and 14-3, designed and configured for different functional circuits. In some other examples, the different first regions are designed for different memory devices, such as the first region 14-1 for non-volatile NAND memory cells, the first region 14-2 for non-volatile NOR memory cells, and the first region 14-3 for static random access memory cells.

The guard ring structure is designed to enhance the fabrication capability (that will be further described at later stage) and remains in the semiconductor structure 12 in accordance with some embodiments. In this case, other functional circuit, such as logic circuit, is formed in the second region 16. The memory circuit in the first region 14 and the logic circuit in the second region 16 are separated by the guard ring structure 18. The guard ring structure is designed to have respective guard rings to enclose the corresponding first regions. For example, a first guard ring structure 18-1 is configured in the second region 16 and is designed to surround the first region 14-1; a second guard ring structure 18-2 is configured in the second region 16 and is designed to surround the first region 14-2; and a third guard ring structure 18-3 is configured in the second region 16 and is designed to surround the first region 14-3. Each guard ring structure is designed to have gaps and dimensions similar those in FIG. 2, 6 or 8.

Referring back to FIGS. 2 and 3, the semiconductor structure 12 includes a substrate 22. The substrate 22 includes silicon. Alternatively or additionally, the substrate 22 may include other elementary semiconductor such as germanium. The substrate 22 may also include a compound semiconductor such as silicon carbide, gallium arsenic, indium arsenide, and indium phosphide. The substrate 22 may include an alloy semiconductor such as silicon germanium, silicon germanium carbide, gallium arsenic phosphide, and gallium indium phosphide. In one embodiment, the substrate 22 includes an epitaxial layer. For example, the substrate 22 may have an epitaxial layer overlying a bulk semiconductor. Furthermore, the substrate 22 may include a semiconductor-on-insulator (SOI) structure. For example, the substrate 22 may include a buried oxide (BOX) layer formed by a process such as separation by implanted oxygen (SIMOX) or other suitable technique, such as wafer bonding and grinding.

The substrate 22 may also include various p-type doped regions and/or n-type doped regions, implemented by a process such as ion implantation and/or diffusion. Those doped regions include n-well, p-well, light doped region (LDD) and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features or devices, such as passive devices resistors or capacitors.

The substrate 22 may also include various isolation regions. The isolation regions separate various device regions in the substrate 22. The isolation regions include different structures formed by using different fabrication technologies. For example, the isolation region may include shallow trench isolation (STI) features. The formation of an STI may include etching a trench in the substrate 22; and filling in the trench with insulator materials such as silicon oxide, silicon nitride, and/or silicon oxynitride. The filled shallow trench isolation features may have a multi-film structure such as a thermal oxide liner layer on the trench sidewall, and then silicon oxide or silicon nitride deposited to fill in the trench. A chemical mechanical polishing (CMP) process may be applied to polish back excessive portions of the insulator materials and planarize the top surface of the isolation features.

Figure 4:
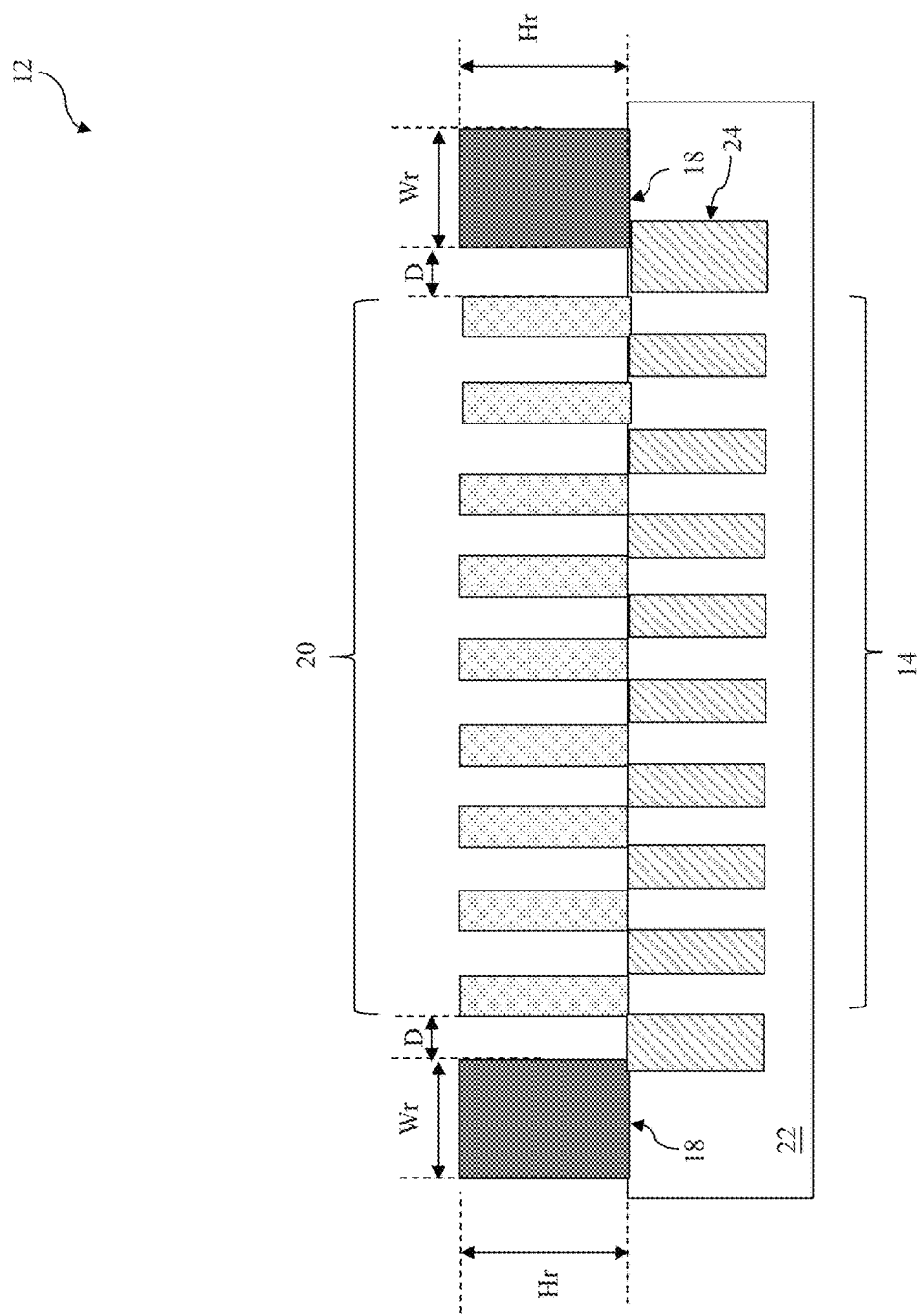
FIGS. 4 and 5 are sectional views of the semiconductor structure in FIG. 2 at various fabrication stages, constructed in accordance with some embodiments.

In the present embodiment as an example for illustration, the semiconductor structure 12 includes three dimensional devices and the circuit features 20 are fin active regions. The fin active regions are active regions extruded from the top surface 22T of the substrate and have three-dimensional profiles. This is further illustrated in FIG. 4 as a sectional view the semiconductor structure 12 in FIG. 2 along the dashed line BB', constructed according to some embodiments. The fin active regions 20 are defined by the shallow trench isolation (STI) features 24. The fin active regions 20 may be formed after the formation of the STI features 24. The formation of the fin active regions 20 includes recessing the STI features 24 in one example; or selectively epitaxially growing in another example.

Figure 5:
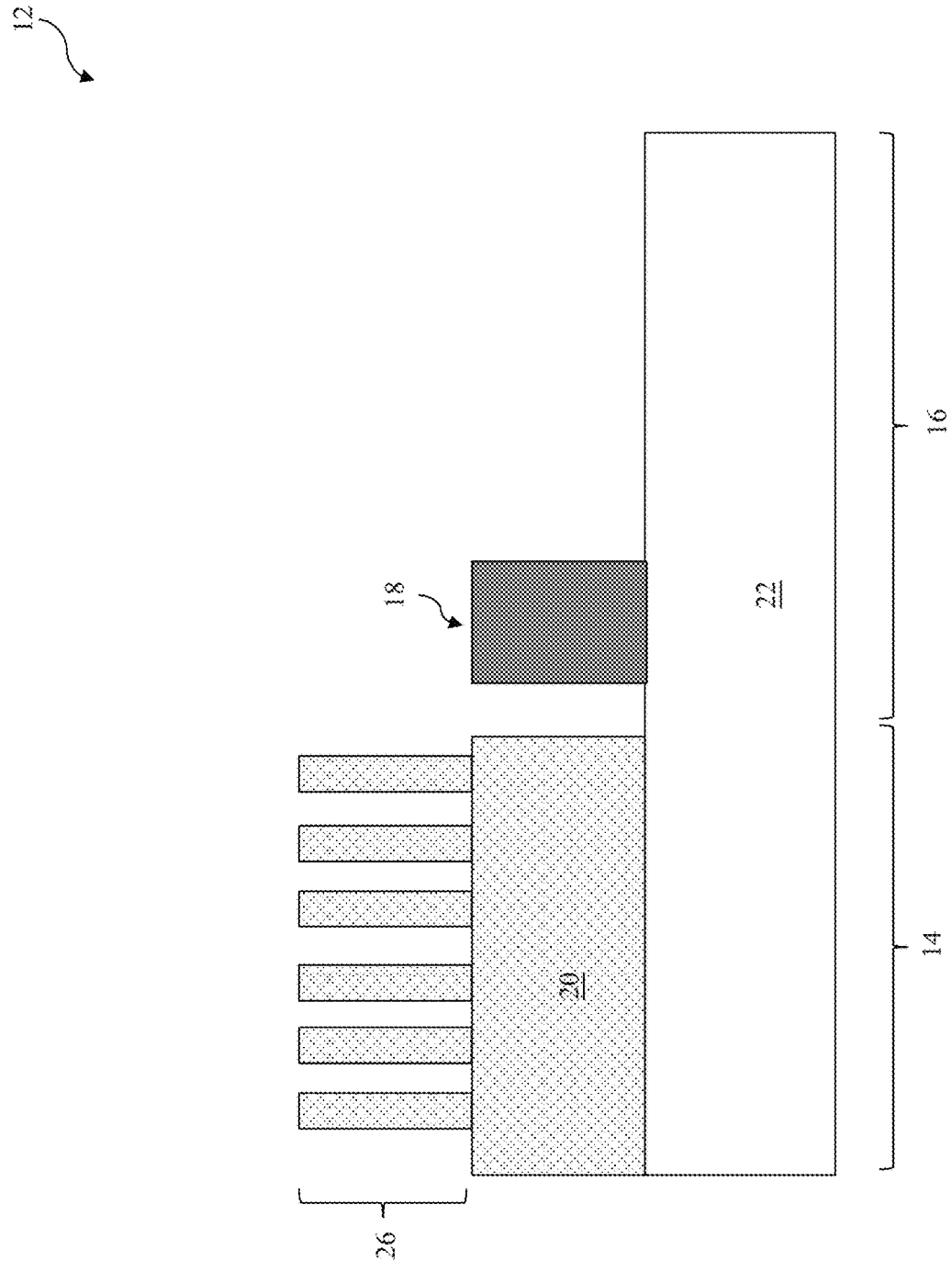

In some embodiments, the semiconductor structure 12 further includes gate stacks 26, as illustrated FIG. 5 in a sectional view of the semiconductor structure 12 in FIG. 2 along the dashed line AA'. The gate stacks 26 each include a gate dielectric layer and a gate electrode disposed on the gate dielectric layer. In some examples, the gate stacks include silicon oxide as the gate dielectric layer and doped polysilicon as the gate electrode. In some other examples, gate stacks include high dielectric constant material layer (high-k dielectric material) as the gate dielectric layer, and metal or metal alloy as the gate electrode. The gate dielectric layer may include one or more dielectric film, such as an interfacial layer (IL) and a high-k dielectric layer on the IL.

In the furtherance of the examples, the high-k dielectric material may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), other suitable materials, or a combination thereof. The IL may be formed by thermal oxidation, ALD or other suitable technique. The high-k dielectric material may be formed by CVD, ALD, PVD, other suitable technique, or a combination thereof.

The gate electrode may include a single layer or alternatively a multi-layer structure, such as a combination of various metal or metal alloy layers tuned with respective parameters, such as a suitable work function to enhance device performance. The gate electrode may include doped semiconductor, metal, metal alloy, metal silicide, or a combination thereof. In some examples, the gate electrode may include Ti, Ag, Al, TiAlN, TaC, TaCN, TaSiN, Mn, Zr, TiN, TaN, Ru, Mo, Al, WN, Cu, W, any suitable conductive materials, and/or a combination thereof. The gate electrode may be deposited by PVD, plating, CVD, ALD, other suitable technique or a combination thereof.

The gate stacks 26 are designed differently. For example, the gate stacks 26 each further include a floating gate electrode inserted in the gate dielectric layer. The floating gate electrode is electrically isolated from the gate electrode (also referred to as control gate) and the channel region by the gate dielectric layer.

The semiconductor structure 12 may also include source/drain (S/D) features (not shown in FIG. 5) formed in the semiconductor substrate and configured adjacent the gate stacks 26. The S/D features may be formed by ion implantation, or selective epitaxial growth to provide strain effect in order to increase the carrier mobility and enhance the device performance. The S/D features and gate stacks are configured to form various devices, such as fin field-effect transistors (FinFETs), and/or non-volatile memory devices.

The formation of the gate stacks 26 includes deposition and patterning. While patterning the deposited gate materials, a patterned photoresist layer is formed on the top. Since the semiconductor structure 12 has an uneven profile, thus formed photoresist layer also has a high topography, causing poor critical dimension (CD) uniformity issue. By utilizing the guarding ring structure 18, the flowable material used in the lithography process is constrained by the guard ring structure, resulting in the patterned photoresist layer has improved topography and better CD uniformity. An exemplary process is further described below. Various gate materials are deposited on the substrate, and a gate hard mask layer may be additionally deposited on the gate materials. Then a photoresist layer is coated thereon. For example, a bottom antireflective coating (BARC) layer is first coated by spin-on coating. The BARC layer functions to reduce reflection during the lithography exposure process and provide etching resistance during the patterning. The formation of the BARC layer includes coating and curing. Since the BARC layer is flowable during the coating stage, the guard ring structure 18 will constrain the flowable material within the first region 14, thereby resulting in more even top surface. The photoresist layer is coated on and is patterned by the lithography exposure process and developing process. The pattern defined in the patterned photoresist layer is transferred to the hard mask and then to the gate materials by etching, resulting in the gate stacks 26, such as those illustrated in FIG. 5.

The semiconductor structure 12 may also include one or more inter-level dielectric (ILD) layer disposed on the semiconductor material. For examples, the ILD layer may include silicon oxide, silicon nitride, silicon oxynitride, a low dielectric constant material (low-k dielectric material), silicon carbide, and/or other suitable layers. The ILD may be deposited by thermal oxidation chemical vapor deposition (CVD), atomic layer deposition (ALD), physical vapor deposition (PVD), thermal oxidation, combinations thereof, or other suitable techniques.

The semiconductor structure 12 may further include various conductive features disposed in the ILD layer and configured to form an interconnect structure that couple various S/D features, the gate stacks and/or other circuit features to form a functional integrated circuit.

Figure 11:
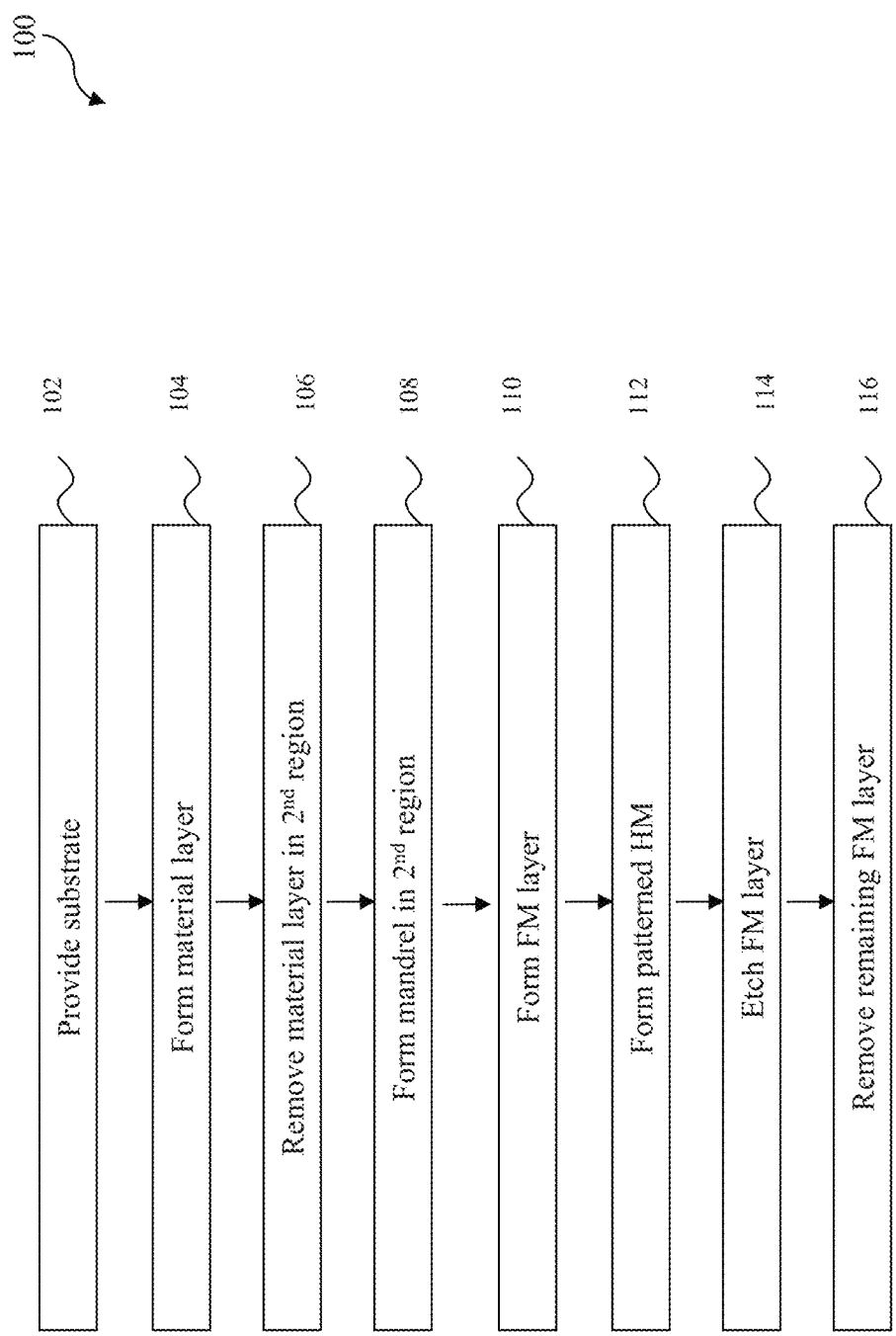
FIG. 11 is a flowchart of an example method for fabricating a semiconductor device constructed in accordance with some embodiments.

The disclosed method and the semiconductor structure formed thereby are further described below according to some embodiment. FIG. 11 is a flowchart of a method 100 of fabricating one or more semiconductor devices in accordance with some embodiments. The method 100 is discussed in detail below, with reference to a semiconductor device 200, shown in FIGS. 12, 13, 14, 15, 16, 17, 18A, 18B, 18C, 18D, 19A and 19B.

Figure 12:
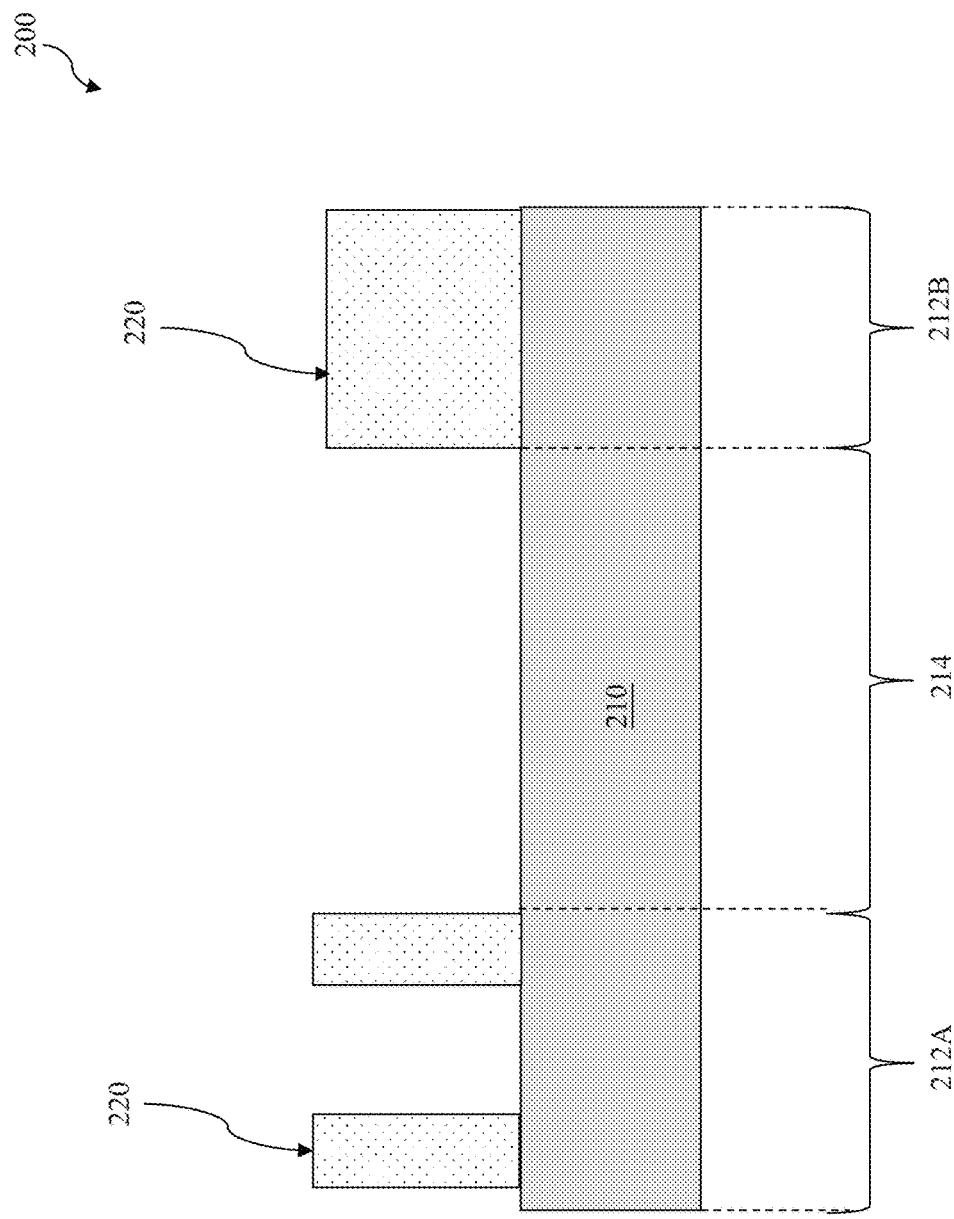
FIGS. 12, 13, 14, 15, 16, 17, 18A, 18B, 18C, 18D, 19A and 19B are cross-sectional views of an example semiconductor device in accordance with some embodiments.

Referring to FIGS. 11 and 12, the method 100 begins at step 102 by providing a semiconductor device 200 having a plurality of features 220 protruding from a substrate 210. The substrate 210 includes silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The semiconductor device 200 may also include various p-type doped regions and/or n-type doped regions, implemented by a process such as ion implantation and/or diffusion. Those doped regions include n-well, p-well, light doped region (LDD) and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The semiconductor device 200 may also include various isolation regions. The isolation regions separate various device regions in the substrate 210. The isolation regions include different structures formed by using different processing technologies. For example, the isolation region may include shallow trench isolation (STI) regions. The formation of an STI may include etching a trench in the substrate 210 and filling in the trench with insulator materials such as silicon oxide, silicon nitride, and/or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The semiconductor device 200 may also include a plurality of inter-level dielectric (ILD) layers such as silicon oxide, silicon nitride, silicon oxynitride, a low-k dielectric, silicon carbide, and/or other suitable layers. The ILD may be deposited by thermal oxidation chemical vapor deposition (CVD), atomic layer deposition (ALD), physical vapor deposition (PVD), thermal oxidation, combinations thereof, or other suitable techniques.

The features 220 may include gate stacks. In some embodiments, gate stacks include dummy gate stacks formed by dielectric layers and poly silicon. In some embodiments, gate stacks include high-k/metal gate (HK/MG) formed by dielectric layers and electrode layers. The dielectric layers may include an interfacial layer (IL) and a HK dielectric layer deposited by suitable techniques, such as chemical vapor deposition (CVD), atomic layer deposition (ALD), physical vapor deposition (PVD), thermal oxidation, combinations thereof, and/or other suitable techniques. The IL may include oxide, HfSiO and oxynitride and the HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), and/or other suitable materials. The electrode layer may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode may include Ti, Ag, Al, TiAlN, TaC, TaCN, TaSiN, Mn, Zr, TiN, TaN, Ru, Mo, Al, WN, Cu, W, any suitable materials, and/or a combination thereof.

The features 220 may also include source/drain (S/D) features, which include germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), and/or other suitable materials. The S/D features may be formed by epitaxial growing processes, such as CVD deposition techniques (e.g., vapor-phase epitaxy (VPE) and/or ultra-high vacuum CVD (UHV-CVD)), molecular beam epitaxy, and/or other suitable processes.

The features 220 may also include conductive features integrated with the ILD layer in the substrate 210 to form an interconnect structure configured to couple the various p-type and n-type doped regions and the other functional features (such as gate electrodes), resulting a functional integrated circuit. In one example, the features 220 may include a portion of the interconnect structure and the interconnect structure includes a multi-layer interconnect (MLI) structure and an ILD layer over the substrate 210 integrated with a MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

In the present embodiment, the semiconductor device 200 has first regions, 212A and 212B, where it has one or more features 220 and a second region 214 where features 220 are absent. The density of features 220 may vary from one first region 212A to another first region 212B. In an example, in one first region 212A, features 220 occupy more than 30% of the first region 212A while in another first region 212B, the feature 220 occupies about 100% of the another first region 212B.

Figure 13:
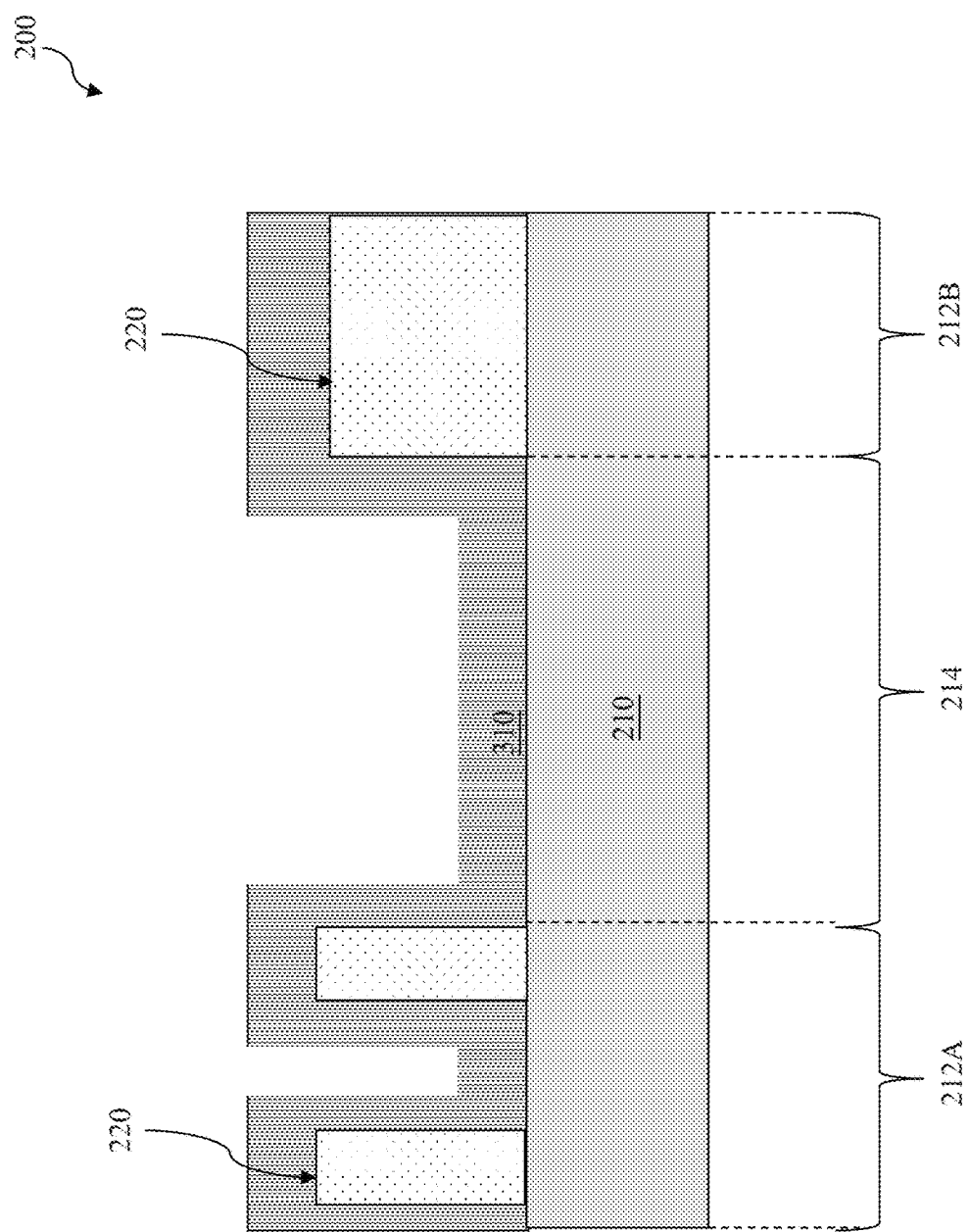

Referring to FIGS. 11 and 13, method 100 proceeds to step 104 by forming a material layer 310 over the substrate 210. The material layer 310 may include silicon oxide, silicon nitride, silicon oxynitride, a low-k dielectric, silicon carbide, and/or other suitable materials. The material layer 310 may be formed by CVD, ALD, PVD, and/or other suitable processes.

Typically, topography of the material layer 310 after deposition is usually influenced (or impacted) by the topography of the substrate 210. Due to absent of features 220 in the second region 214, it is common that material layer 310 has a non-flat topography (or rugged topography) after it is formed over the substrate 210, such that a top surface of the material layer 310 in the first regions, 212A and 212B, is higher than it is in the second region 214. This rugged topography of the material layer 310 may create loading effect in a subsequent etching process and result in poor uniformity of critical dimension (CD). For example, a CD of an etching-formed feature located in the first regions, 212A and 212B, close to the second region 214 is different than those in the first regions, 212A and 212B, located farther away from the second region 214. The present disclosure provides a method of reducing topography difference between the first region and the second region and improving etching CD uniformity.

Figure 14:
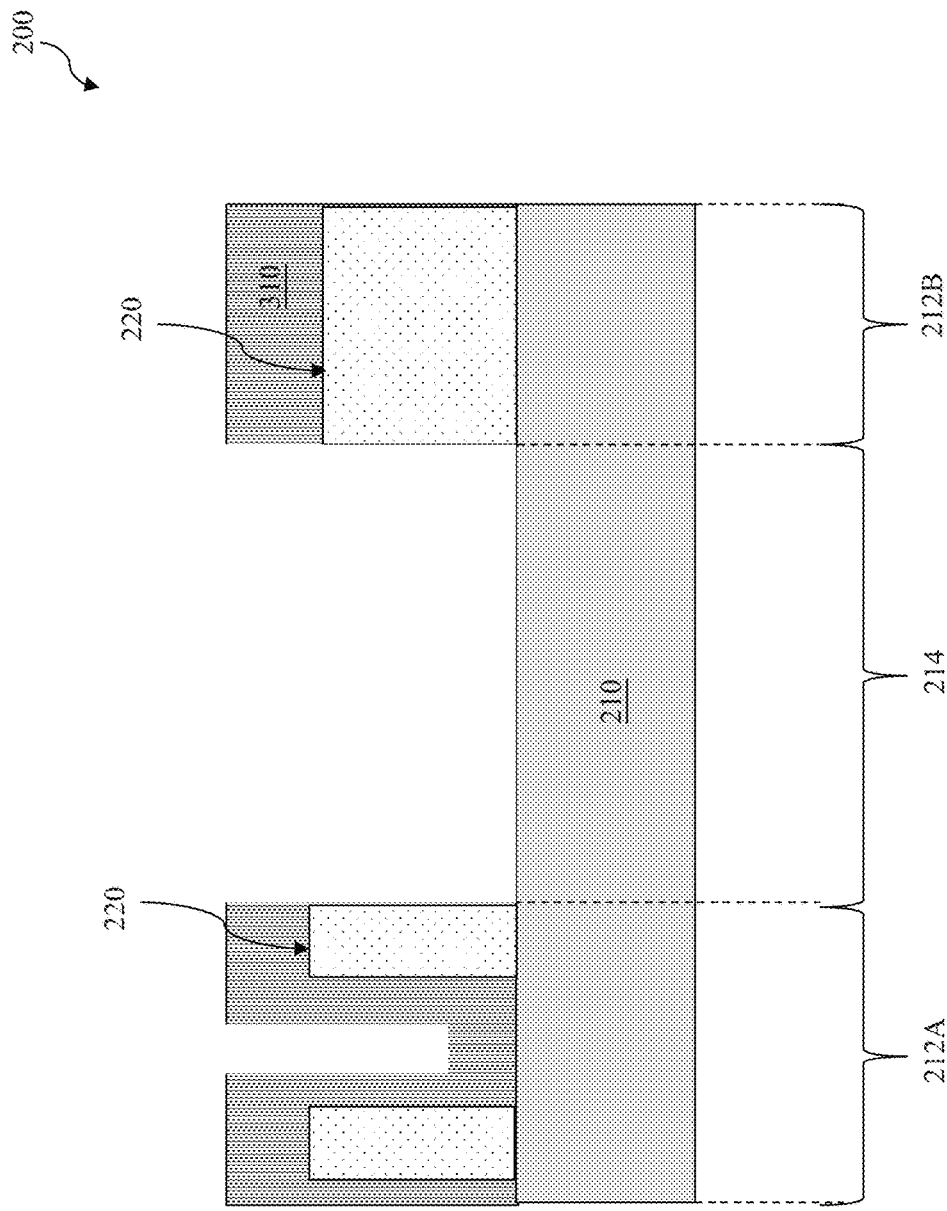

Referring to FIGS. 11 and 14, method 100 proceeds to step 106 by removing the material layer 310 from the second region 214. In some embodiments, a patterned hard mask (HM) is formed over the material layer 310 such that the material layer 310 in the first regions, 212A and 212B, are covered by the patterned HM while it is exposed in the second region 214. Then the exposed material layer 310 is etched. In some embodiments, the patterned HM is a patterned photoresist layer and formed by a by a lithography process. Alternatively, the patterned HM may be formed by depositing a HM layer, forming a patterned photoresist layer over the HM layer by a lithography process and etching the HM material layer through the patterned photoresist layer to form the patterned HM. The etch process may include a wet etch, a dry etch, and/or a combination thereof.

Figure 15:
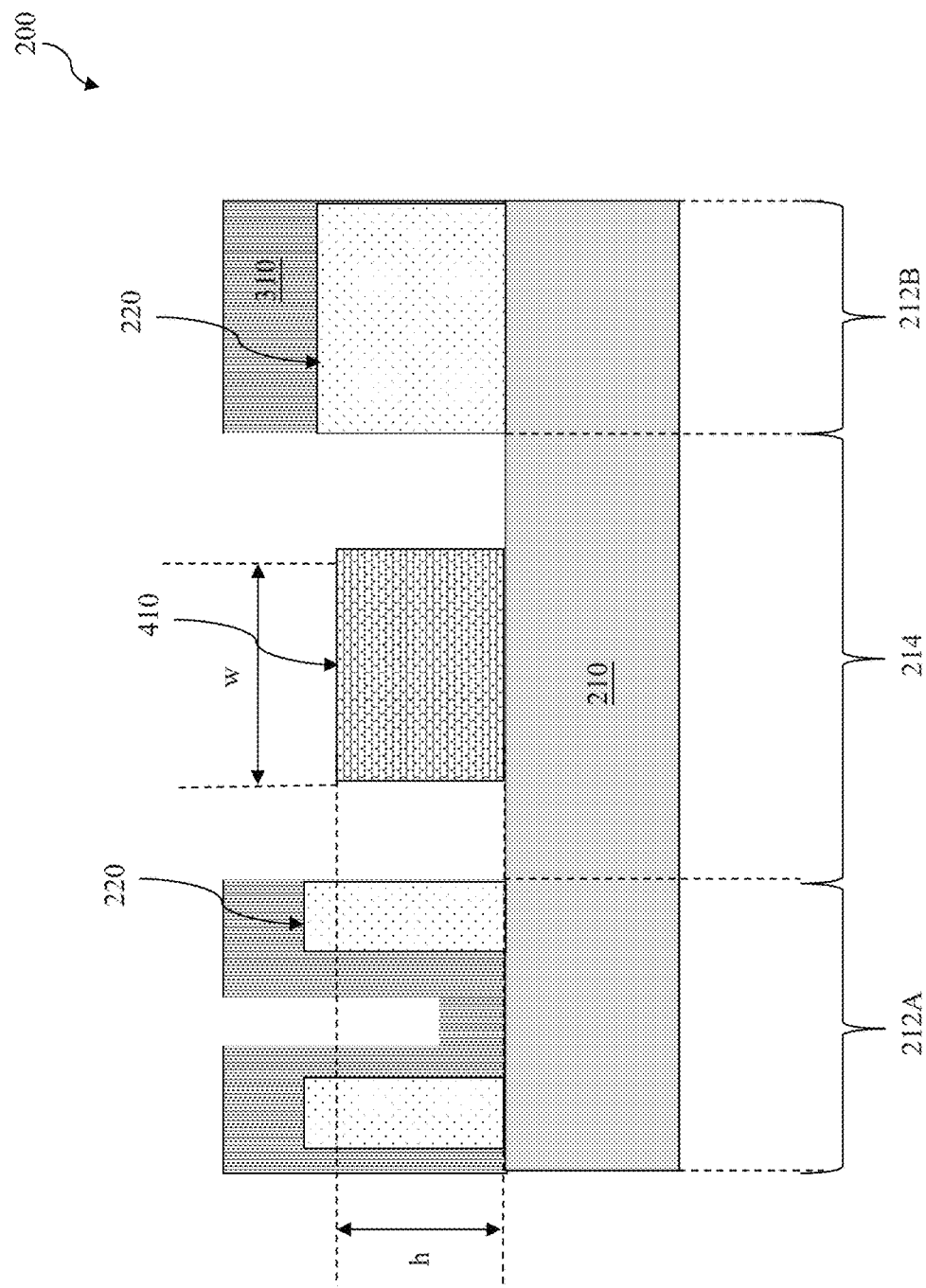

Referring to FIGS. 11 and 15, method 100 proceeds to step 108 by forming one or more mandrel features 410 (also referred to as guard rings, or collectively guard ring structure) in the second region 214. The mandrel 410 is formed with a width w and a height h. In the present embodiment, the mandrel feature 410 is designed such that the width w may vary from one mandrel feature 410 to another mandrel feature 410 and vary from one second region 214 to another second region 214. Also, a total number of the mandrel features 410 may vary from one second region 214 to another second region 214. The mandrel feature 410 may include silicon oxide, silicon oxynitride, polyimide, spin-on-glass (SOG), spin-on-polymer (SOP), combinations thereof, and/or other suitable materials. In some embodiments, the mandrel feature 410 includes a material which is different from the material layer 310 to achieve etching selectivity in subsequent etches.

The mandrel feature 410 may be formed by a procedure including deposition, patterning, etching, and/or a combination thereof. In some embodiments, the formation of the mandrel 410 may include depositing a mandrel material layer; forming a resist pattern; and etching the mandrel material layer using the resist layer as an etch mask, thereby forming the mandrel 410. The mandrel material layer may include silicon oxide, silicon nitride, oxynitride, polyimide, spin-on-glass (SOG), spin-on-polymer (SOP), combinations thereof, and/or any suitable materials. The mandrel material layer may include multiple layers. The mandrel material layer may be deposited by a suitable technique, such as CVD, PVD, ALD, spin-on coating, and/or other suitable technique. The patterning process includes coating a resist layer on the mandrel material layer, performing a lithography exposure process to the resist layer and developing the exposed resist layer to form the resist pattern. The etching process includes a wet etch, a dry etch, and/or a combination there.

Figure 16:
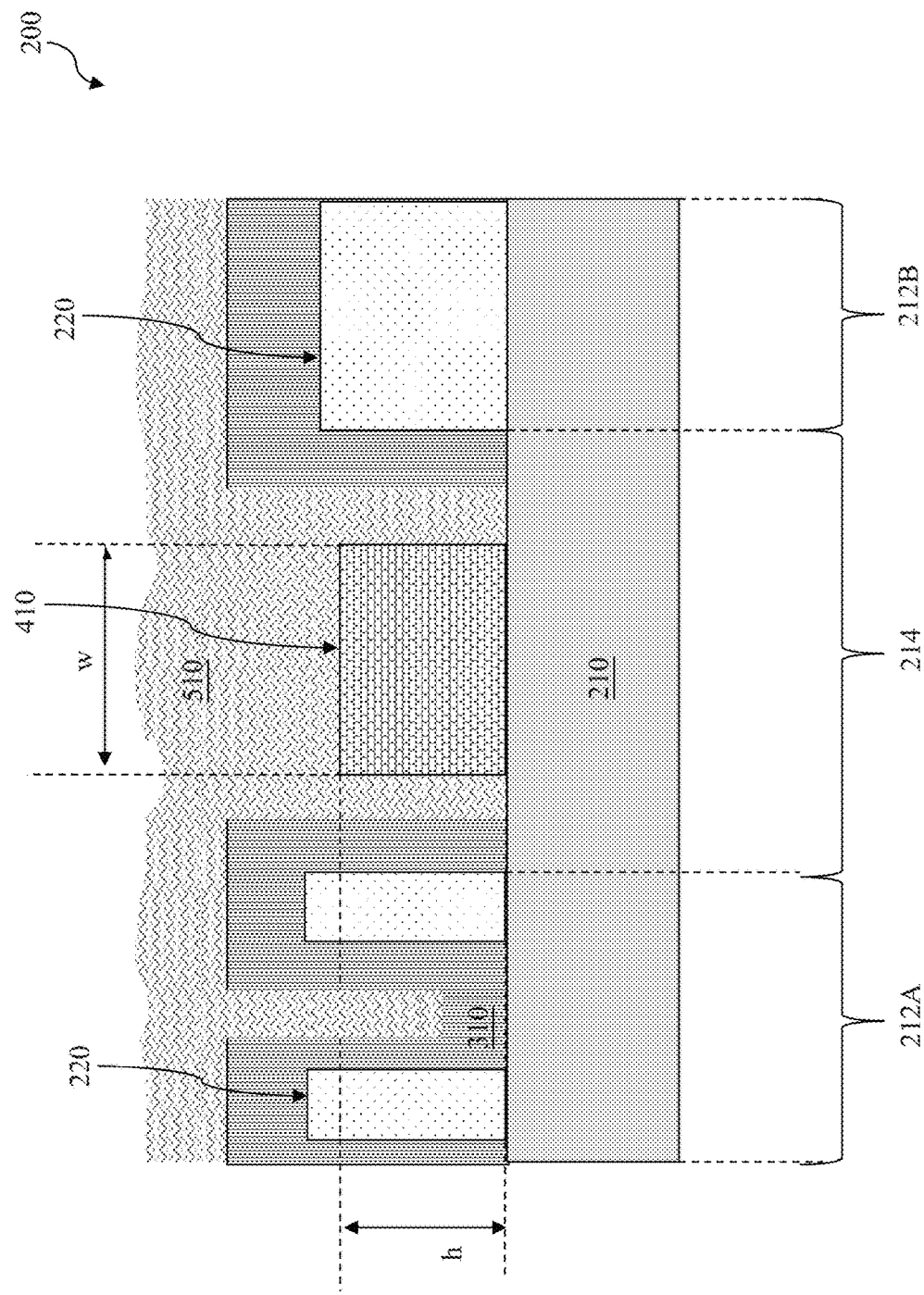

Referring to FIGS. 11 and 16, method 100 proceeds to step 110 by forming a flow able-material (FM) layer 510 over the material layer 310 and the mandrel feature 410. A FM is a material which fills in spaces between each of features 220 with a flowing nature. The FM layer 510 may include polyimide, spin-on-glass (SOG), spin-on-polymer (SOP), combinations thereof, and/or other suitable materials. In some embodiments, the FM layer 510 includes a material which is different from the mandrel feature 410 to achieve etching selectivity in subsequent etches. The FM layer 510 may be formed by spin-on coating, CVD, and/or other suitable techniques. As has been mentioned above, by choosing width w and height h of the mandrel feature 410, the FM layer 510 has a more planarized topography.

Figure 17:
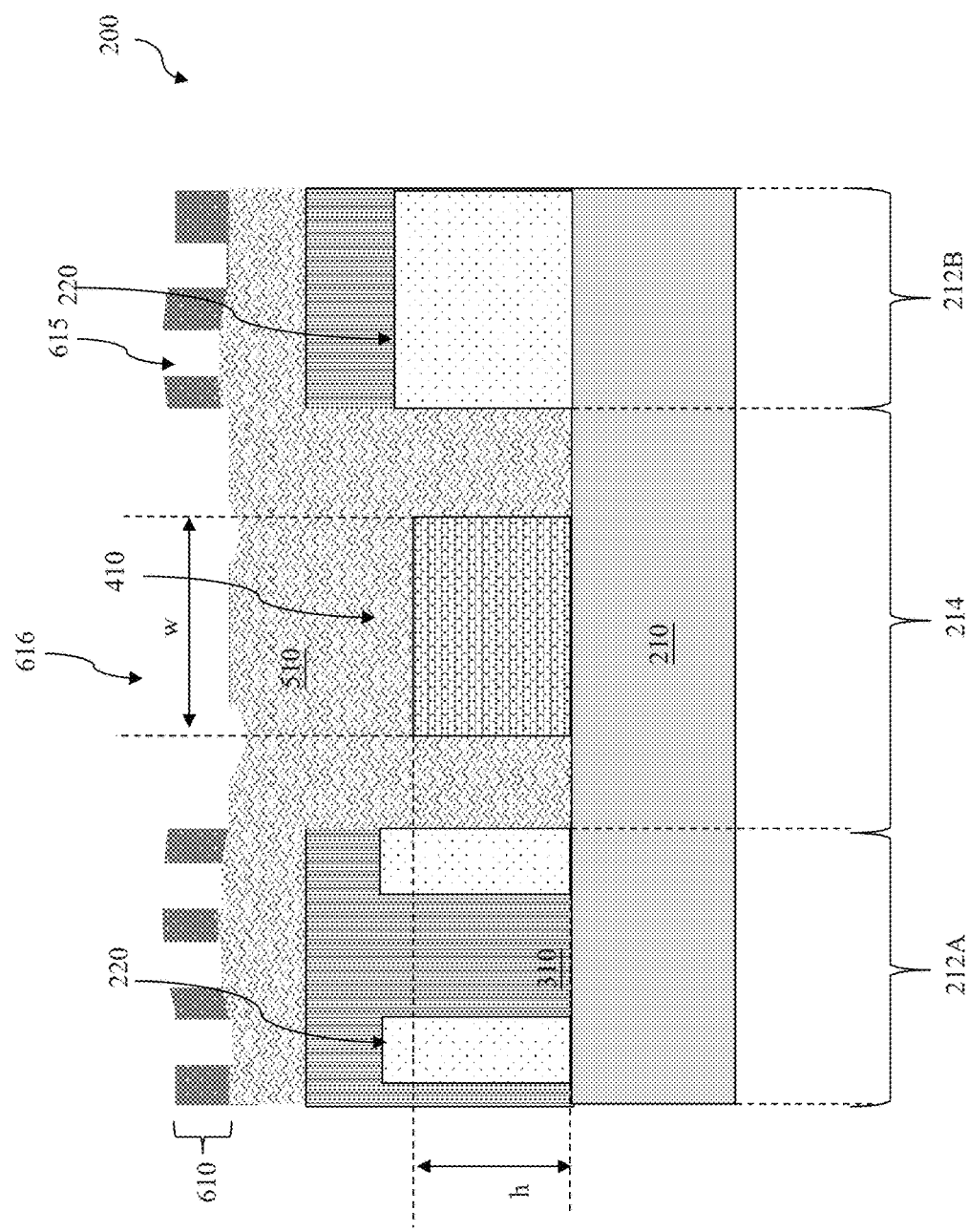

Referring to FIGS. 11 and 17, method 100 proceeds to step 112 by forming a patterned hard mask (HM) 610 over the FM layer 510. In some embodiments, the patterned HM 610 is a patterned photoresist layer and formed by a by a lithography process. An exemplary lithography process may include forming a photoresist layer, exposing the photoresist layer by a lithography exposure process, performing a post-exposure bake process, and developing the photoresist layer to form the patterned resist layer. Alternatively, the patterned HM 610 may be formed by depositing a HM layer, forming a patterned photoresist layer over the HM layer by a lithography process and etching the HM material layer through the patterned photoresist layer to form the patterned HM. The etch process may include a wet etch, a dry etch, and/or a combination thereof. The pattered HM 610 has a plurality of first openings 615 in the first regions 212A and 212B and a second opening 616 to expose the FM layer 510 in the second region 214.

Figure 18A:
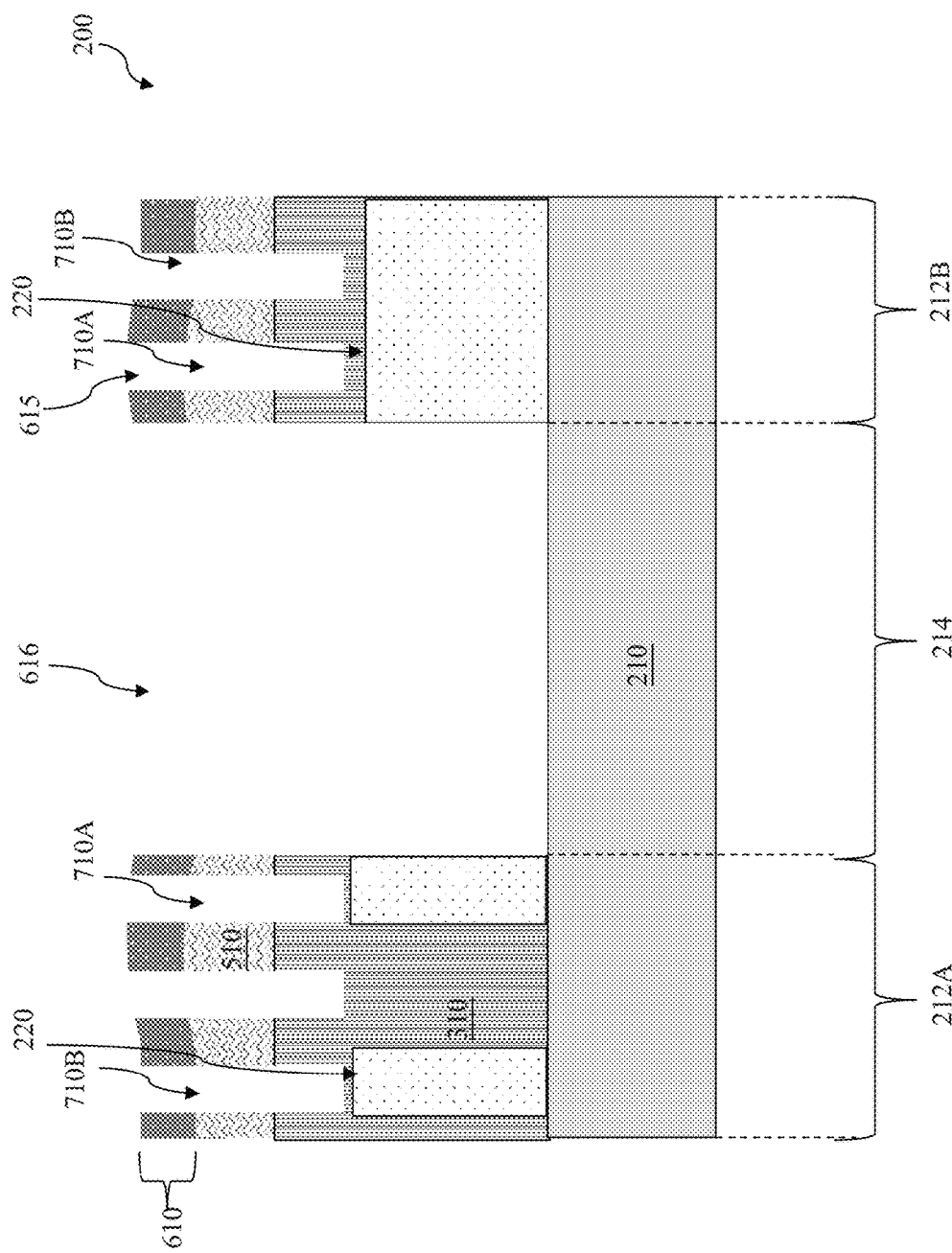

Referring to FIGS. 11 and 18A, method 100 proceeds to step 114 by etching the FM layer 510 and the material layer 310 through the first openings 615 to form trenches 710A and 710B in the material layer 310. The etching of the FM layer 510 also occurs in the second region where the etching removes the FM layer 510 and the mandrel feature 410 through the second opening 616 to expose a portion of the substrate 210. For the sake of clarity and to better illustrate the concepts of the present disclosure, reference numeral 710A identifies the trenches located closest to second region 214 while reference numeral 710B identifies trenches located farther away from second region 214. The etch process may include a wet etch, a dry etch, and/or a combination thereof. As an example, the trench etch includes a plasma dry etching process using a fluorine-based chemistry, such as $CF_4$, $SF_6$, $CH_2F_2$, $CHF_3$, and/or $C_2F_6$. As another example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant.

Alternatively, as has been mentioned previously, the etch process is chosen to etch the FM layer 510 and the material layer 310 without etching the mandrel feature 410. Therefore the mandrel feature 410 remains in the second region 214 to designate a structure for later process integration, as shown in FIG. 18B.

Figure 18B:
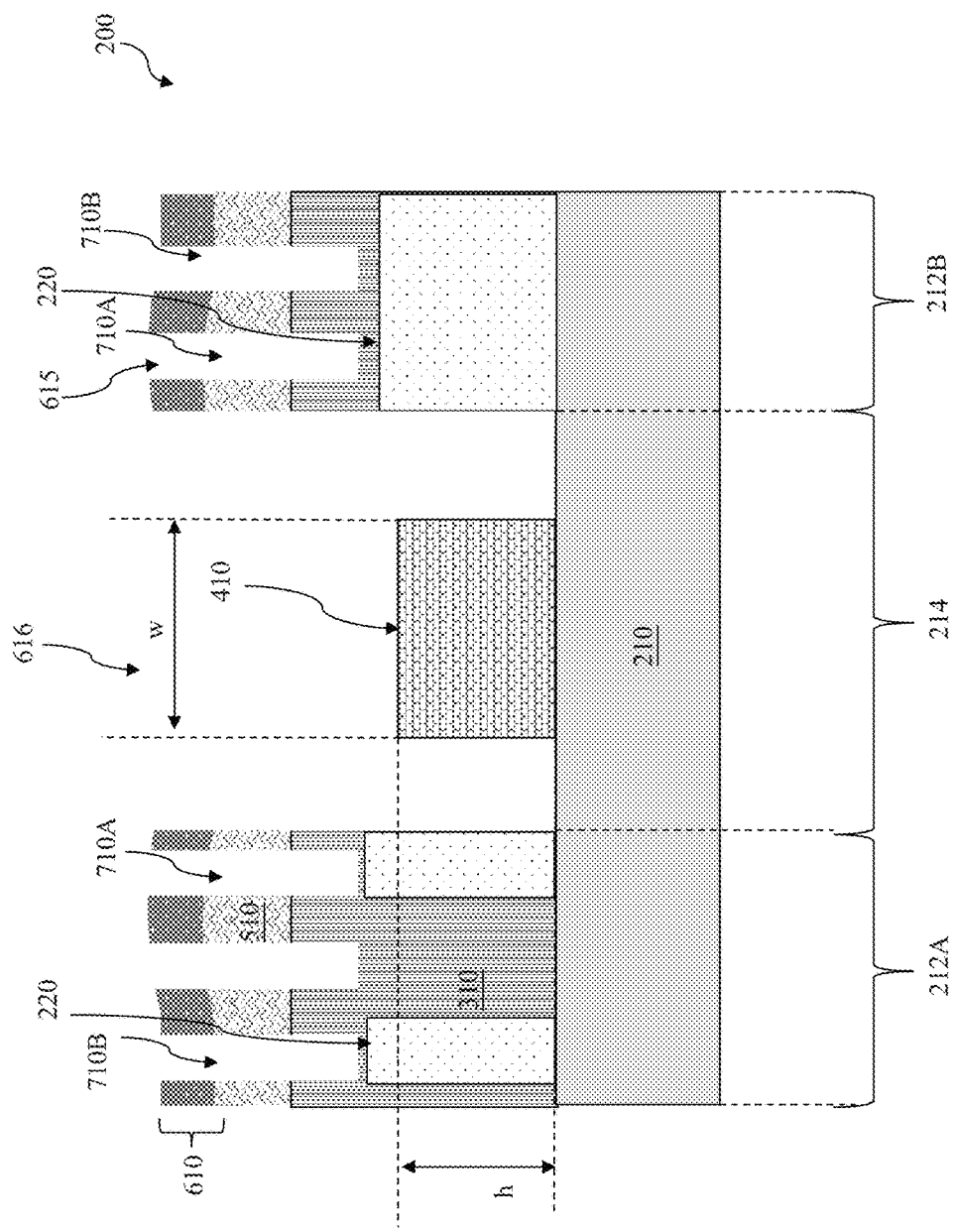
Figure 18C:
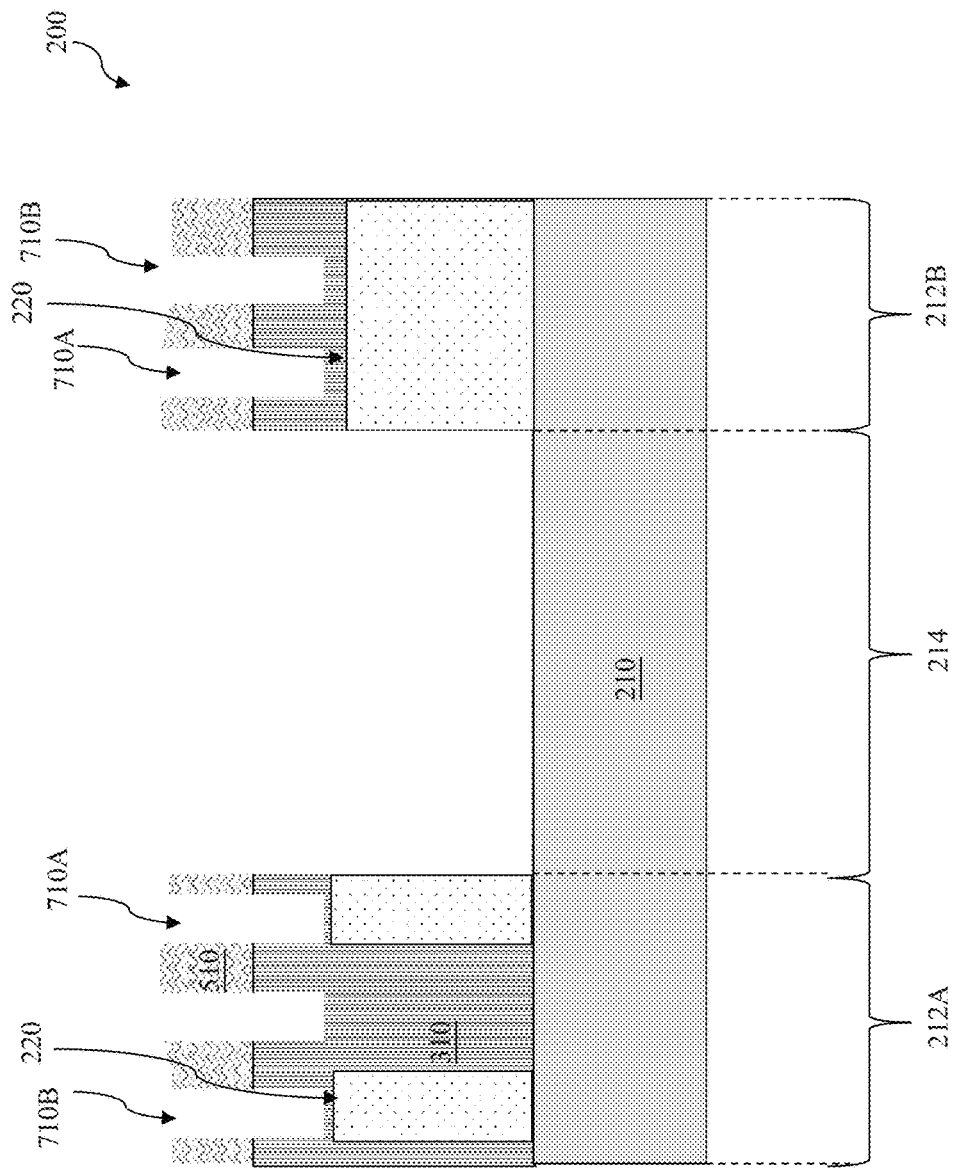
Figure 18D:
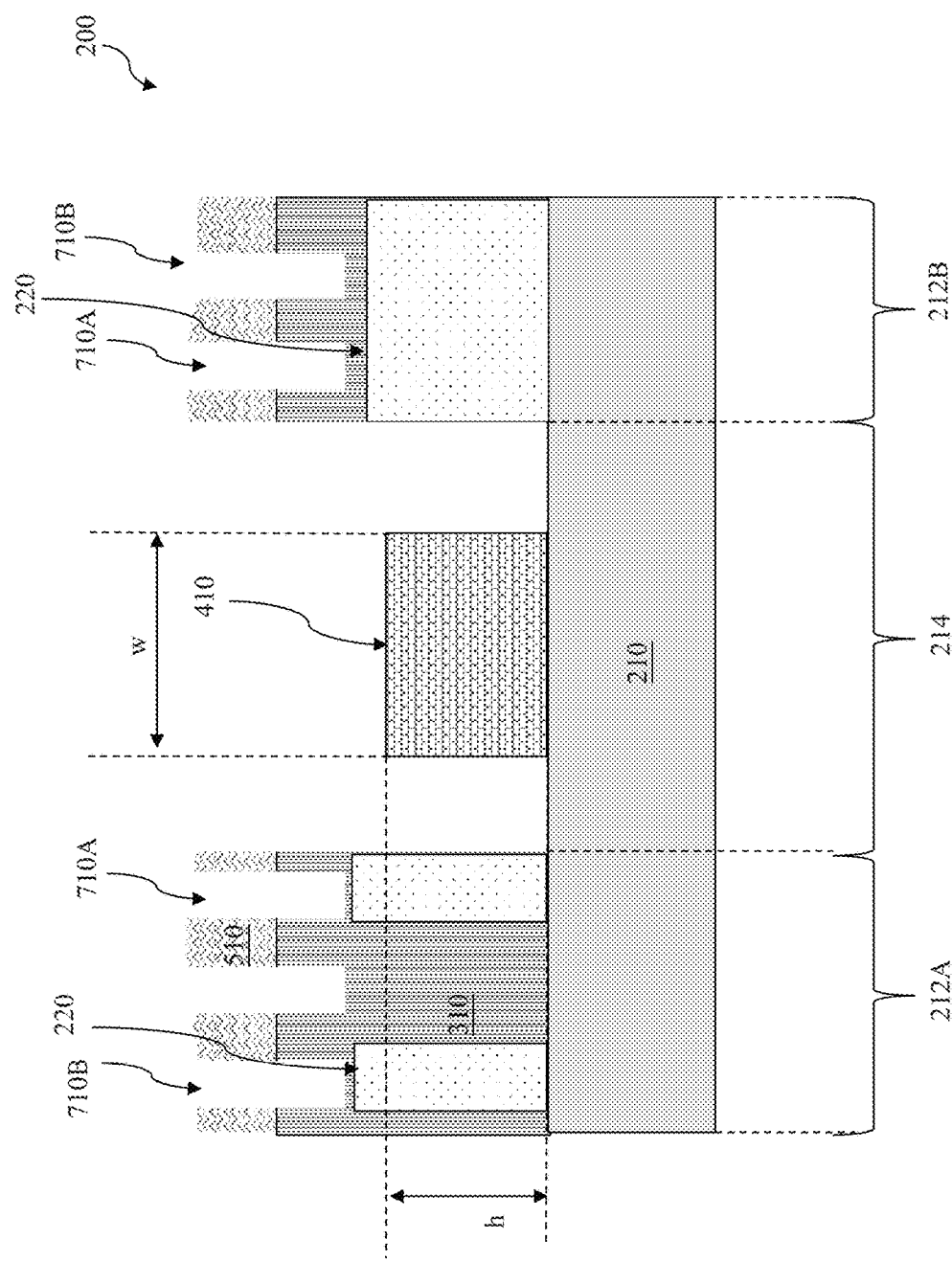
Figure 19A:
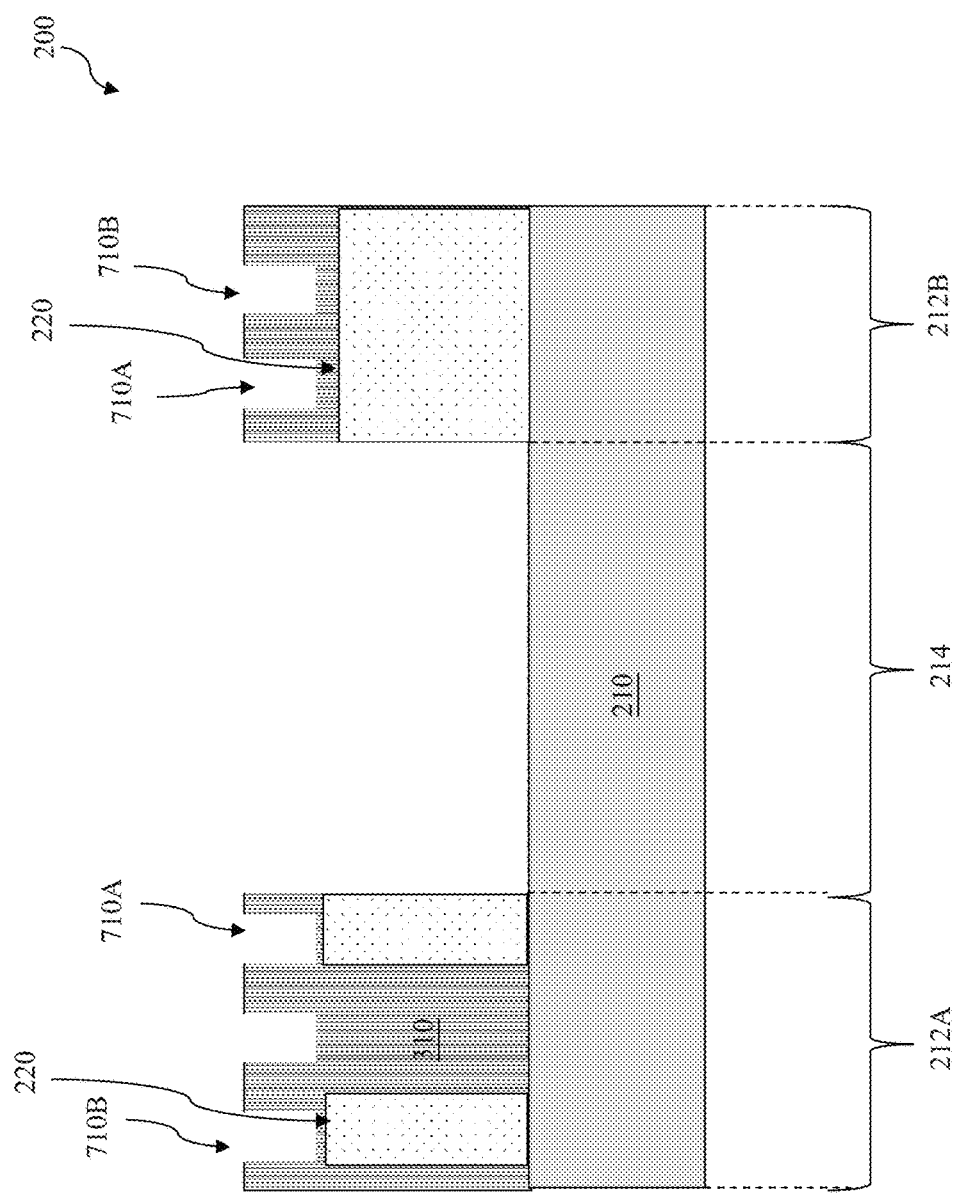
Figure 19B:
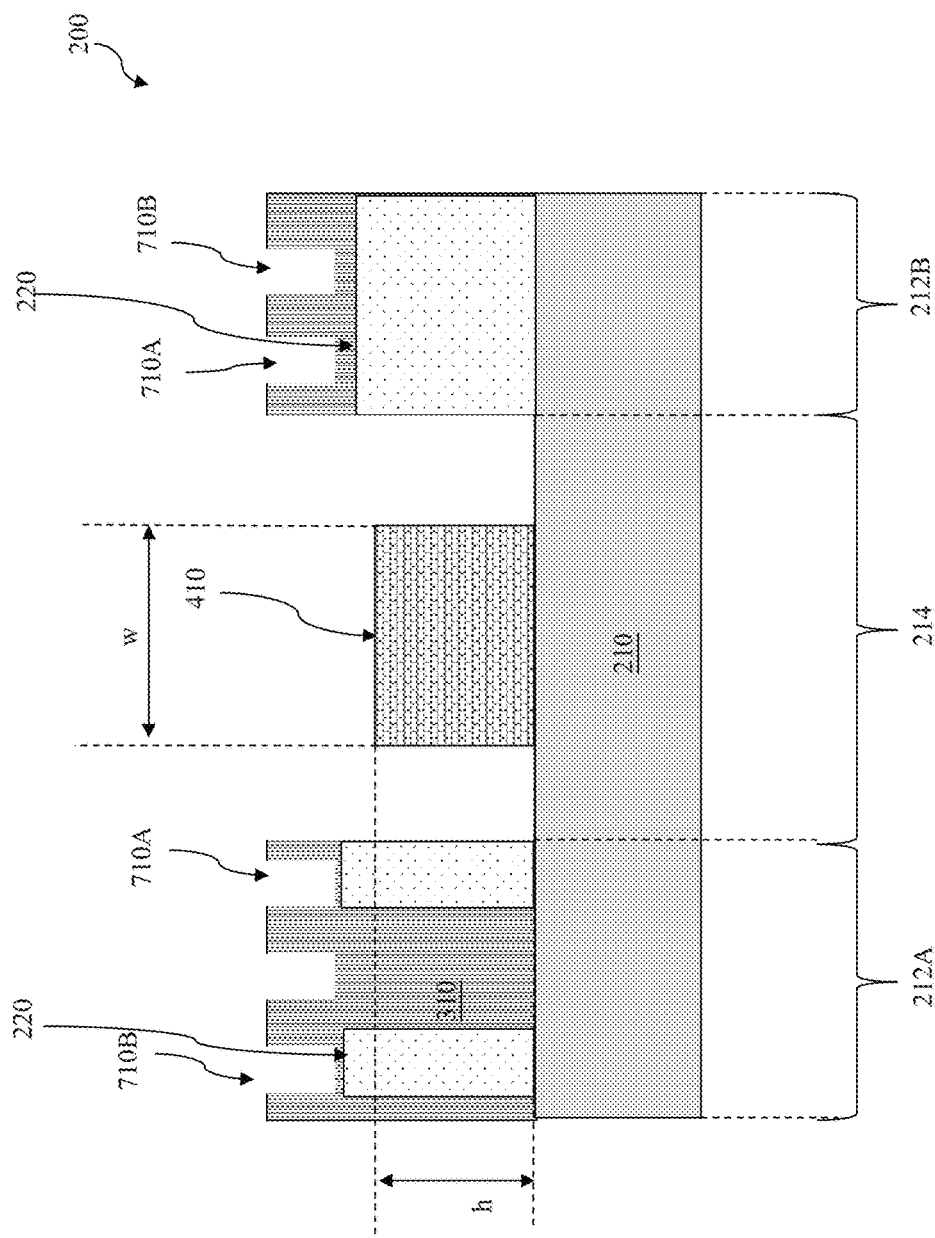

As shown in FIGS. 18A and 18B, the plurality of trenches 710A and 710B are formed with uniformed CDs. After forming the trenches 710A and 710B, the patterned HM 610 is removed by a proper etching process, as shown in FIG. 18C (in conjunction with the process described with respect to FIG. 18A) and in FIG. 18D ((in conjunction with the process described with respect to FIG. 18B). In an embodiment, the patterned photoresist layer 610 is removed wet stripping and/or plasma ashing, Referring to FIGS. 11, 19A (in conjunction with the process described with respect to FIG. 18C) and 19B (in conjunction with the process described with respect to FIG. 18D), method 100 proceeds to step 116 by removing the remaining FM layer 510. The etch process may include a wet etch, a dry etch, and/or a combination thereof. In the present embodiment, the etch process is chosen to selectively etching the remaining FM layer 510 without substantially etching the material layer 310, the mandrel feature 410, the features 220 and the substrate 210. As a result, in the first regions 212A and 212B, the trenches 710A and 710B still have uniform CDs.

Additional steps can be provided before, during, and after the method 100, and some of the steps described can be replaced or eliminated for other embodiments of the method.

Figure 20:
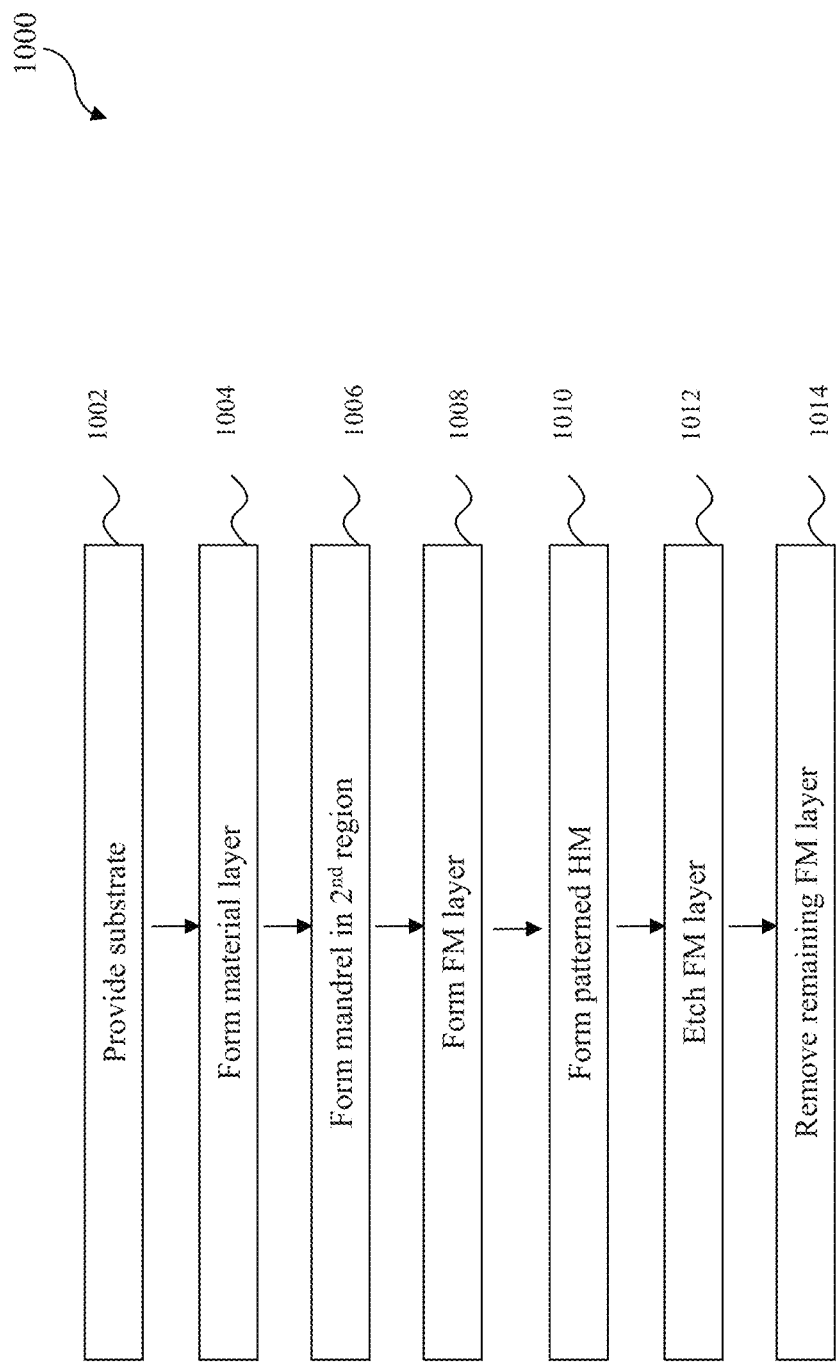
FIG. 20 is another flowchart of an example method for fabricating a semiconductor device constructed in accordance with some embodiments.
Figure 2U:
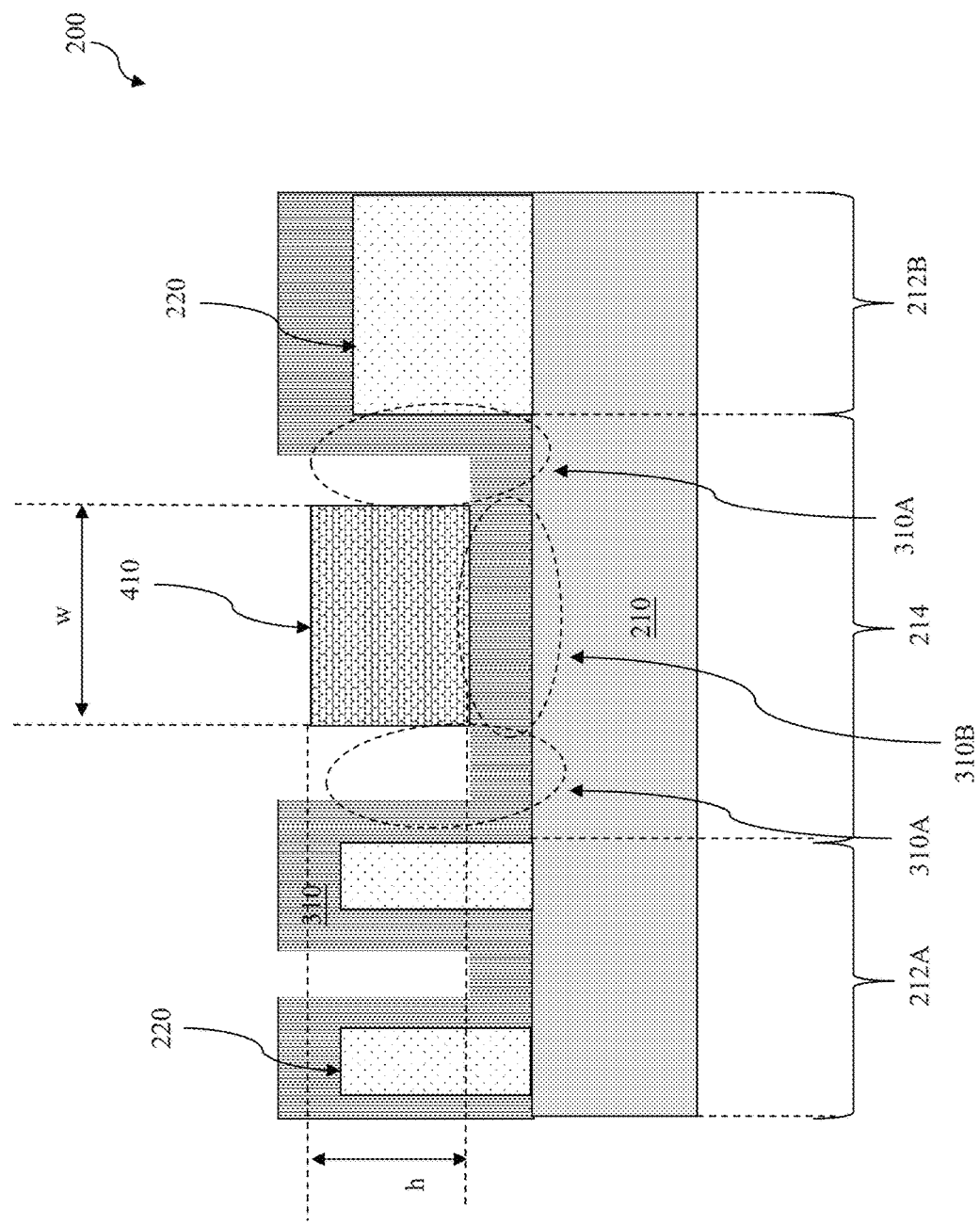

FIG. 20 is a flowchart of another example method 1000 for fabricating the device 200. The steps 1002 and 1004, are similar to those discussed above in steps 102 and 104 of method 100. Thus, the discussion above with respect to steps 102 and 104 is applicable to the steps 1002 and 1004, respectively. The present disclosure repeats reference numerals and/or letters in the various embodiments. This repetition is for the purpose of simplicity and clarity such that repeated reference numerals and/or letters indicate similar features amongst the various embodiments unless stated otherwise.

Referring to FIGS. 20 and 21, method 1000 proceeds to step 1006 by forming the mandrel feature 410 over the material layer 310 in the second region 214. As a result, a first portion 310A of the material layer 310 is positioned beside the mandrel feature 410 and a second portion 310B of the material layer 310 is positioned underneath the mandrel feature 410. The step 1006 is similar to those discussed above in step 108. Thus, the discussion above with respect to step 108 is applicable to step 1006.

Figure 22:
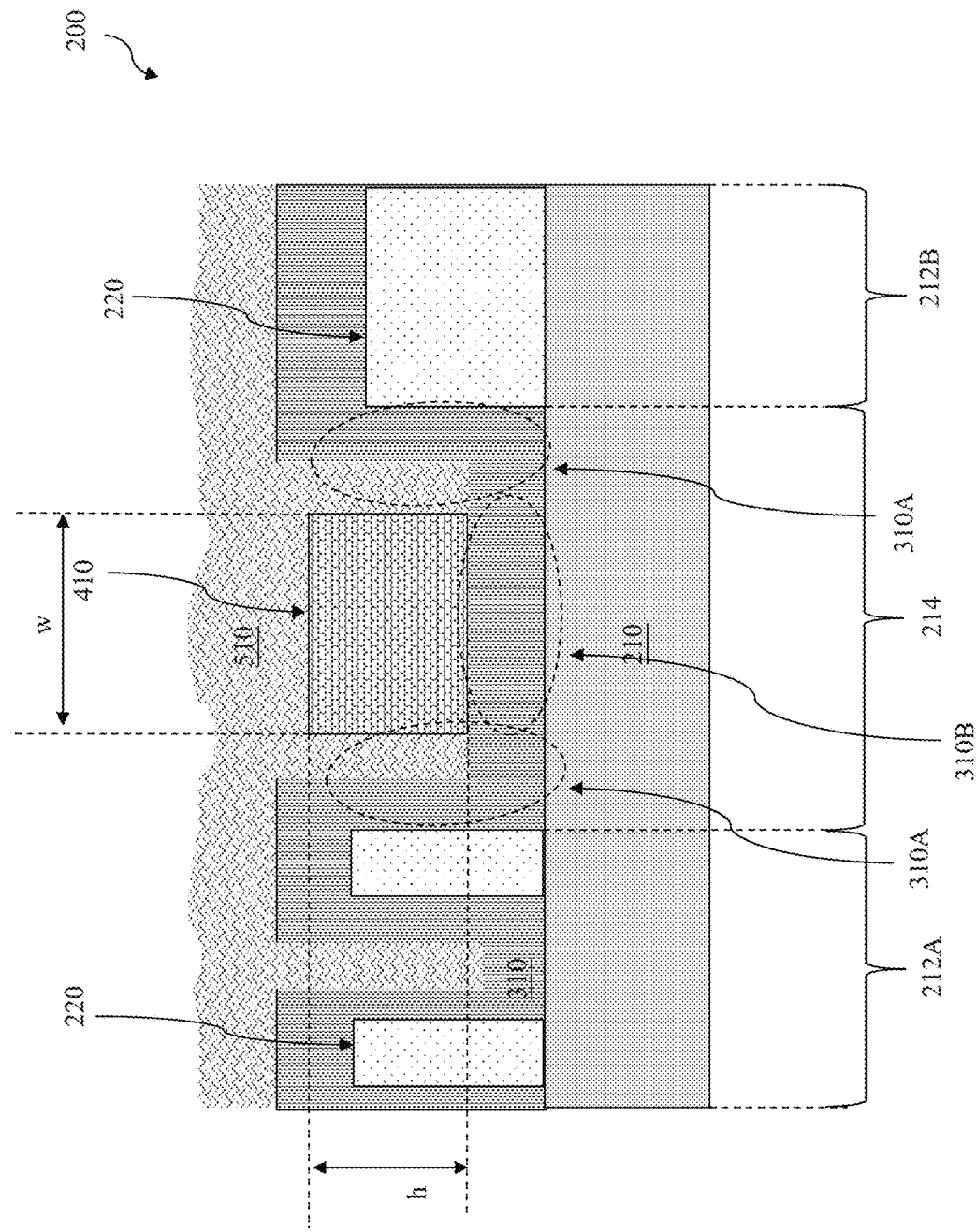

Referring to FIGS. 20 and 22, method 1000 proceeds to step 1008 by forming the FM layer 510 over the material layer 310 and the mandrel feature 410. The step 1008 is similar to those discussed above in step 110. Thus, the discussion above with respect to step 110 is applicable to step 1008.

Figure 23:
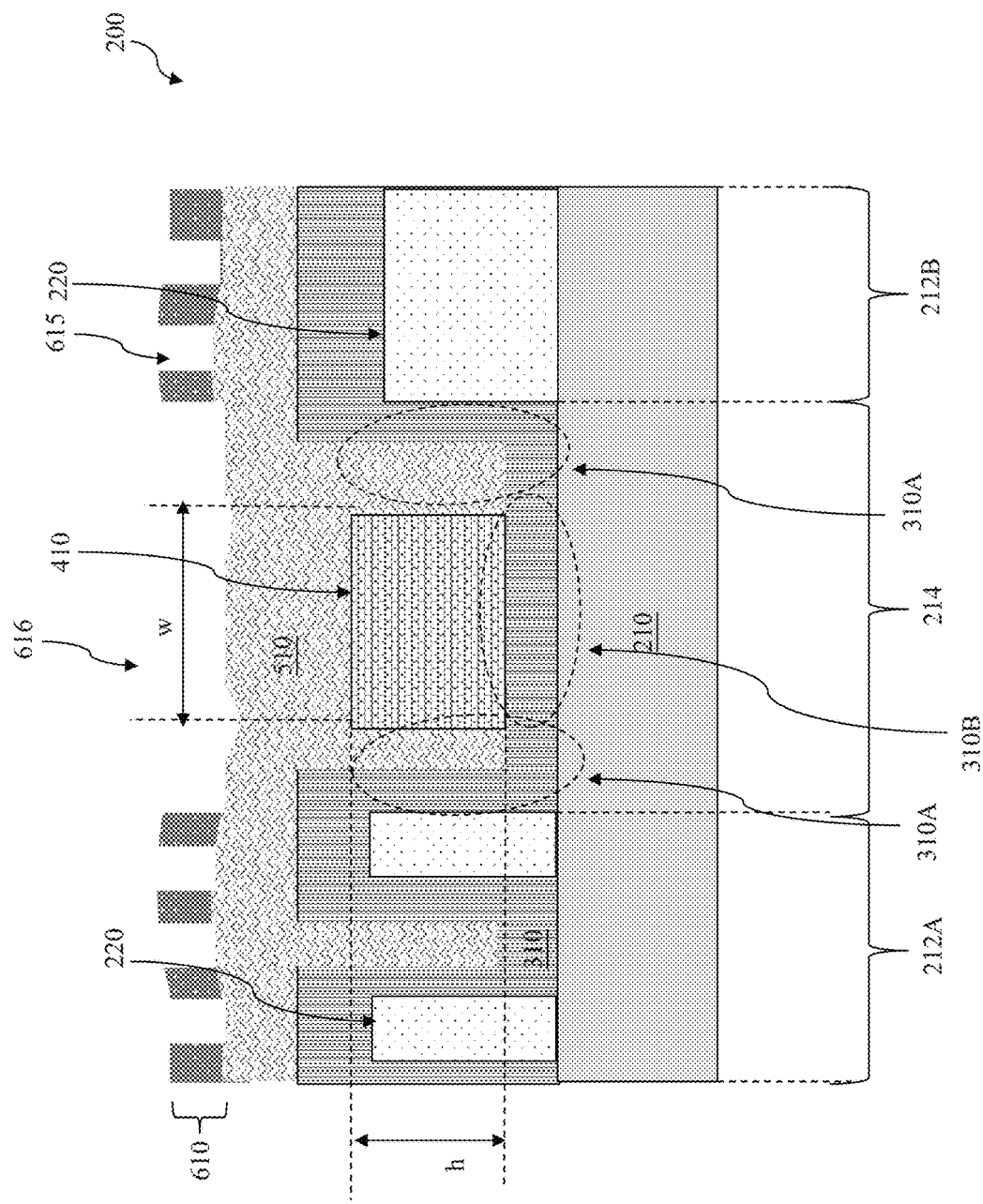

Referring to FIGS. 20 and 23, method 1000 proceeds to step 1010 by forming the patterned HM 610 is over the FM layer 510. The step 1010 is similar to those discussed above in step 112. Thus, the discussion above with respect to step 112 is applicable to step 1010.

Figure 24A:
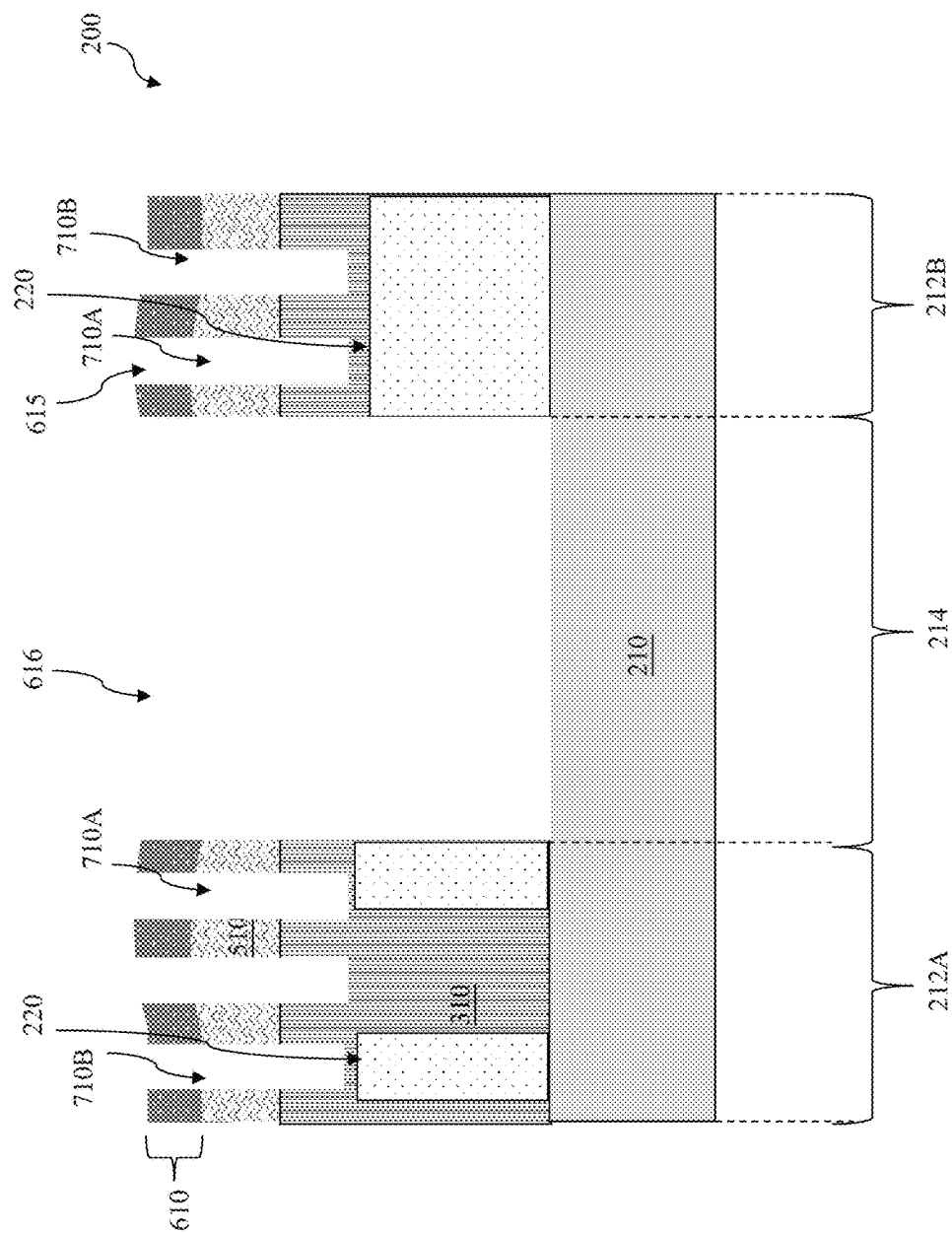

Referring to FIGS. 20 and 24A, method 1000 proceeds to step 1012 by etching the FM layer 510 and the material layer 310 through the first openings 615 to form trenches 710A and 710B in the material layer 310 and etching the FM layer 510 and the mandrel feature 410 (both of the first portion 310A and the second portion 310B) through the second opening 616 in the second region 214. The step 1012 is similar to those discussed above in step 114. Thus, the discussion above with respect to step 114 is applicable to step 1012.

Alternatively, as has been mentioned previously, the etch process is chosen to etch the FM layer 510 and the material layer 310 without etching the mandrel feature 410. Therefore the mandrel feature 410 and the second portion 310B of the material layer 310 remain in the second region to provide a designate structure for later process integration, as shown in FIG. 24B.

Figure 25A:
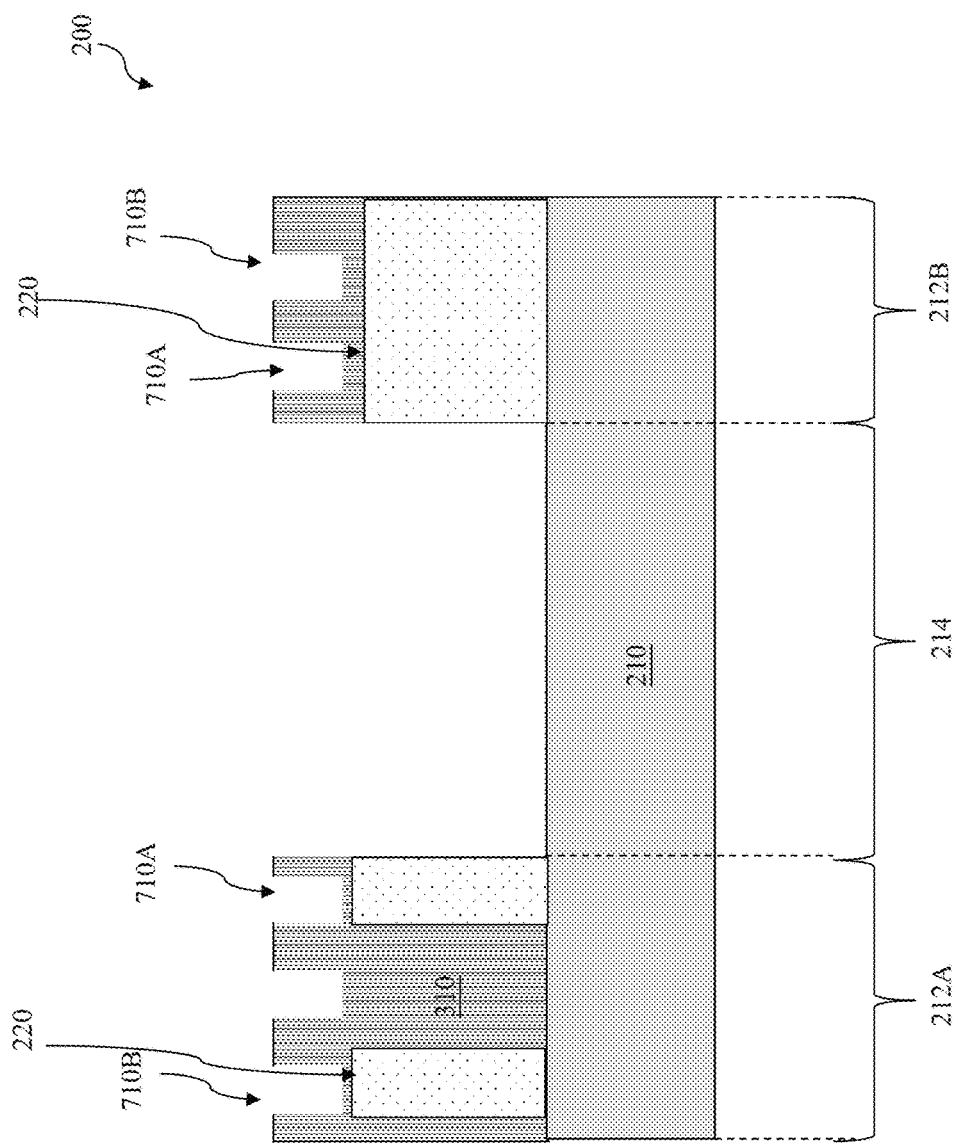
Figure 25B:
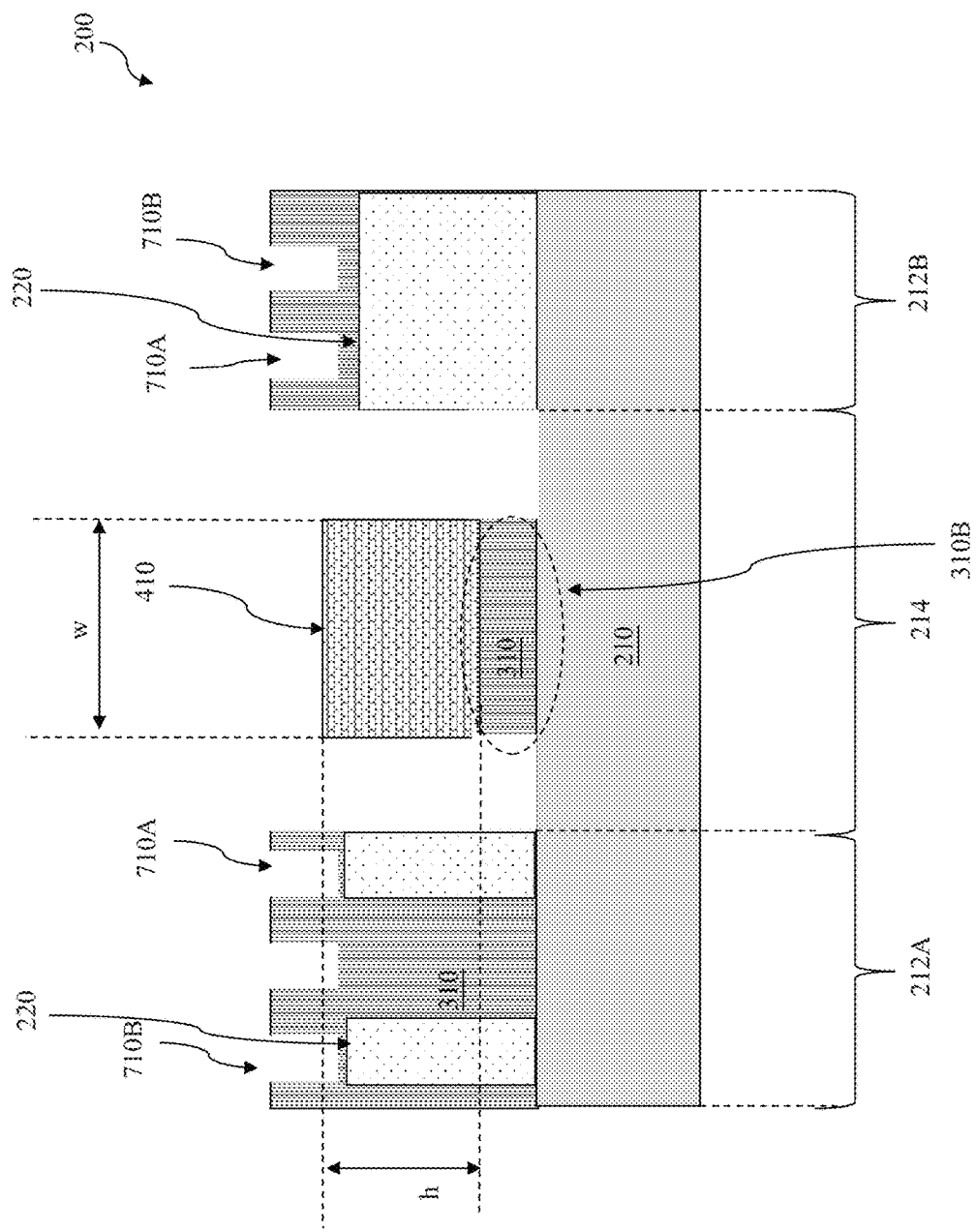

Referring to FIGS. 20, 25A (in conjunction with the process described with respect to FIG. 14A) and 15B (in conjunction with the process described with respect to FIG. 24B), method 1000 proceeds to step 1014 by removing the remaining FM layer 510. The step 1014 is similar to those discussed above in step 116. Thus, the discussion above with respect to step 116 is applicable to step 1014. As a result, in the first regions 212A and 212B, the trenches 710A and 710B still have uniform CDs.

Additional steps can be provided before, during, and after the method 1000, and some of the steps described can be replaced or eliminated for other embodiments of the method.

Figure 26:
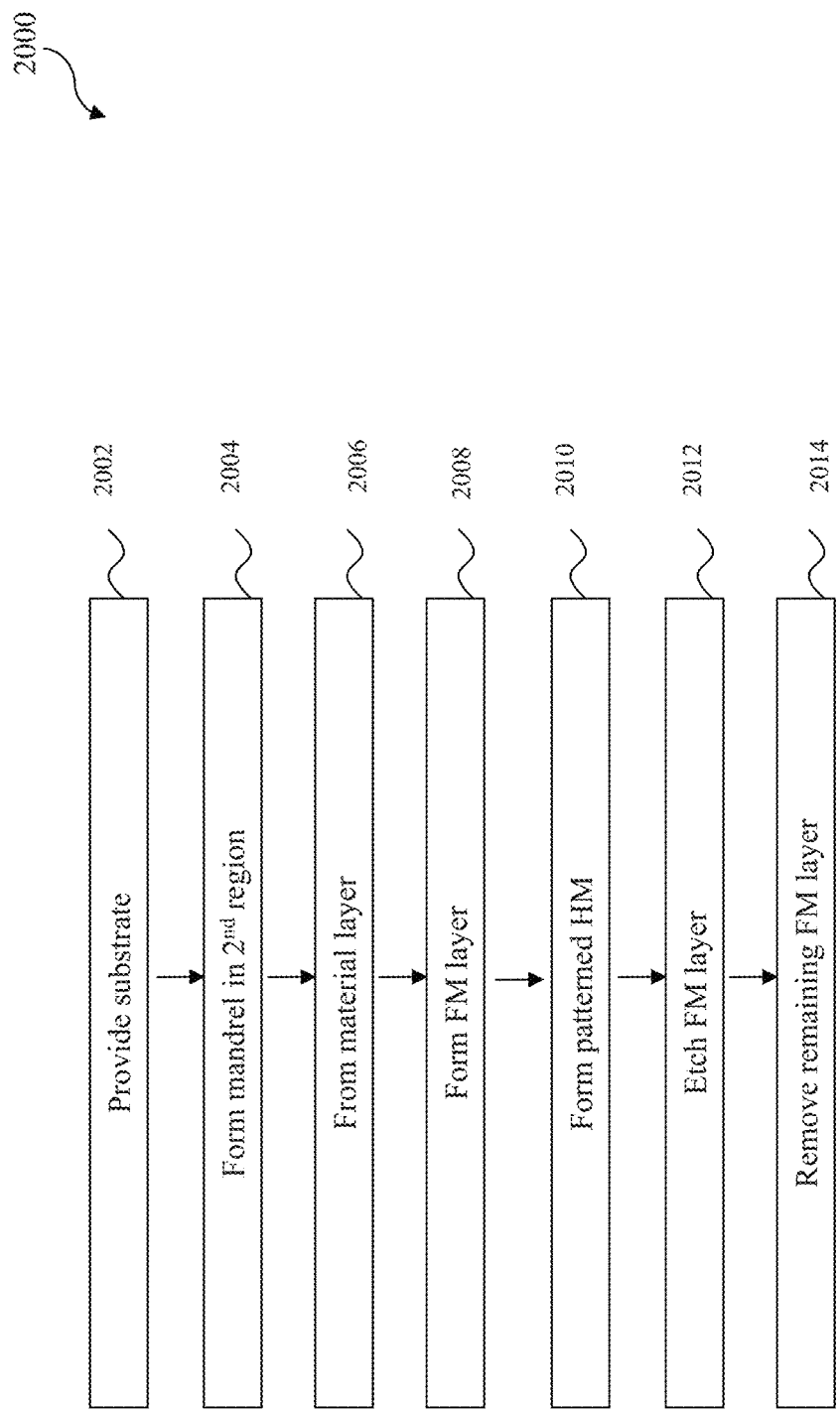
FIG. 26 is another flowchart of an example method for fabricating a semiconductor device constructed in accordance with some embodiments.

FIG. 26 is a flowchart of another example method 2000 for fabricating the device 200. Step 2002 is similar to those discussed above in step 102 of method 100. Thus, the discussion above with respect to step 102 is applicable to step 2002. The present disclosure repeats reference numerals and/or letters in the various embodiments. This repetition is for the purpose of simplicity and clarity such that repeated reference numerals and/or letters indicate similar features amongst the various embodiments unless stated otherwise.

Figure 27:
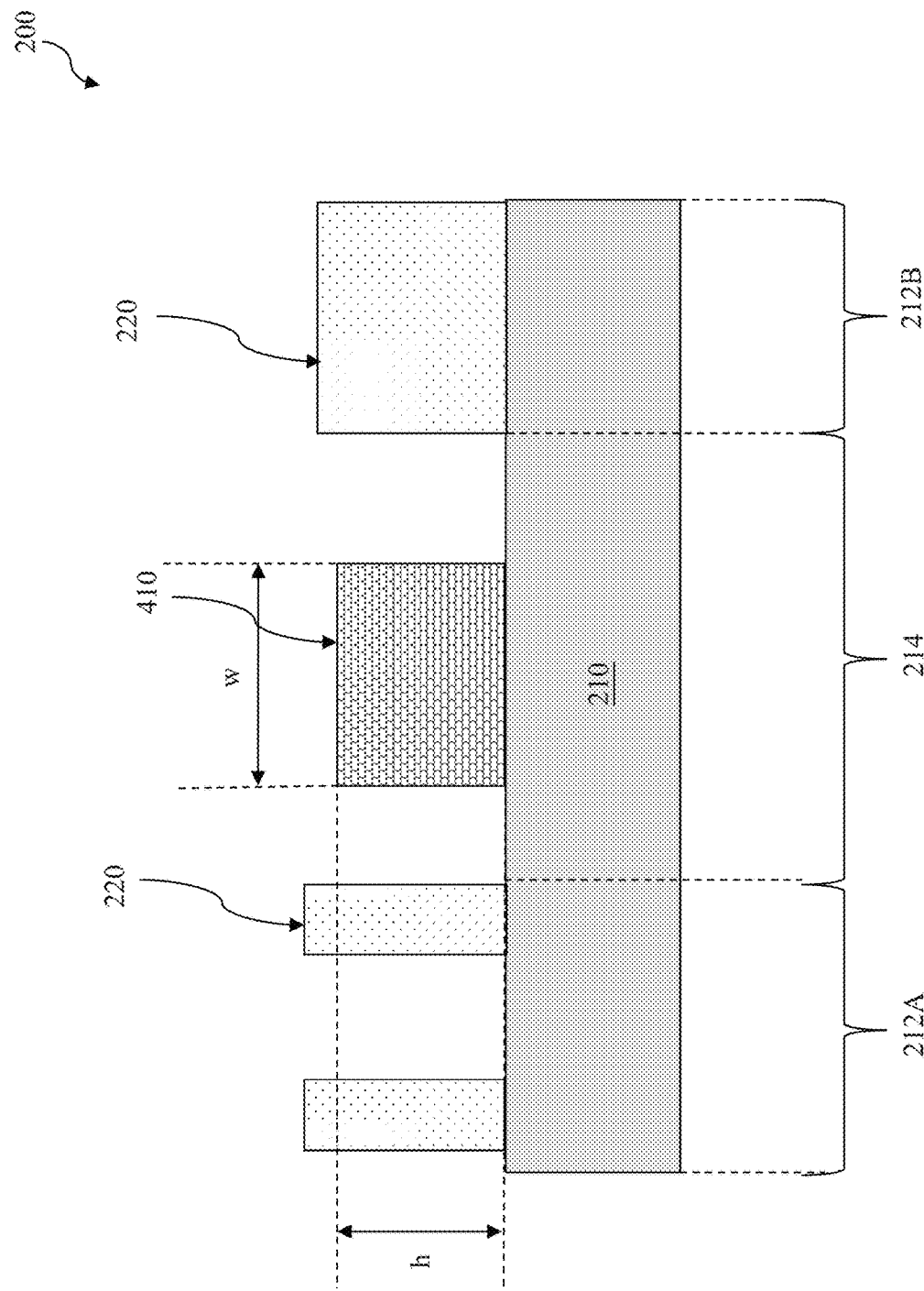
FIGS. 27, 28, 29, 30, 31A, 31B, 32A and 32B are cross-sectional views of an example semiconductor device in accordance with some embodiments.

Referring to FIGS. 26 and 27, method 2000 proceeds to step 2004 by forming the mandrel feature 410 over the substrate 210 in the second region 214. The step 2004 is similar to those discussed above in step 108. Thus, the discussion above with respect to step 108 is applicable to step 2004.

Figure 28:
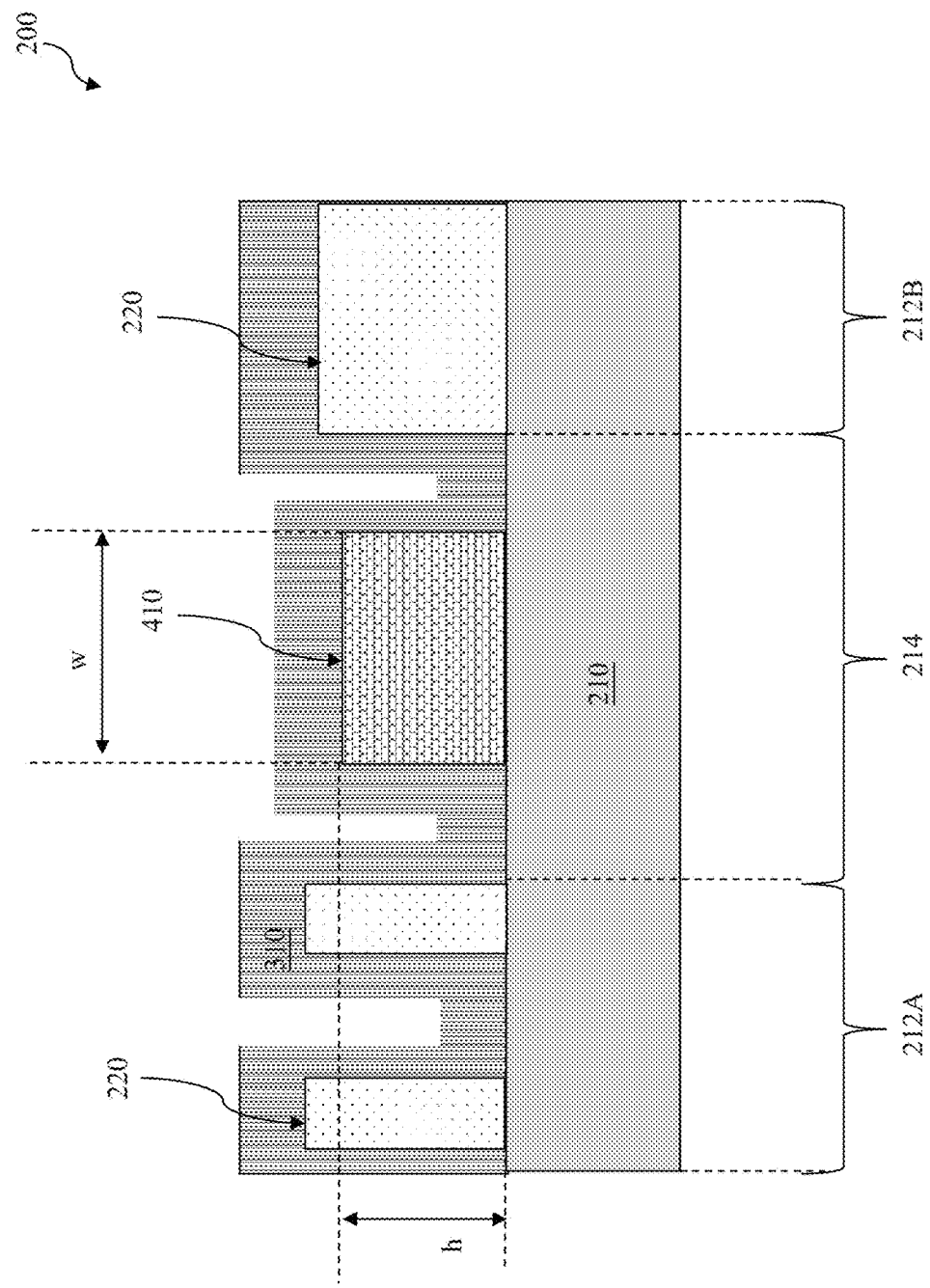

Referring to FIGS. 26 and 28, method 2000 proceeds to step 2006 by forming the material layer 310 over the features 220 and the mandrel feature 410. The material layer 310 is formed similarly in many respects to the material layer 310 discussed above with FIG. 3, including the materials discussed therein.

Figure 29:
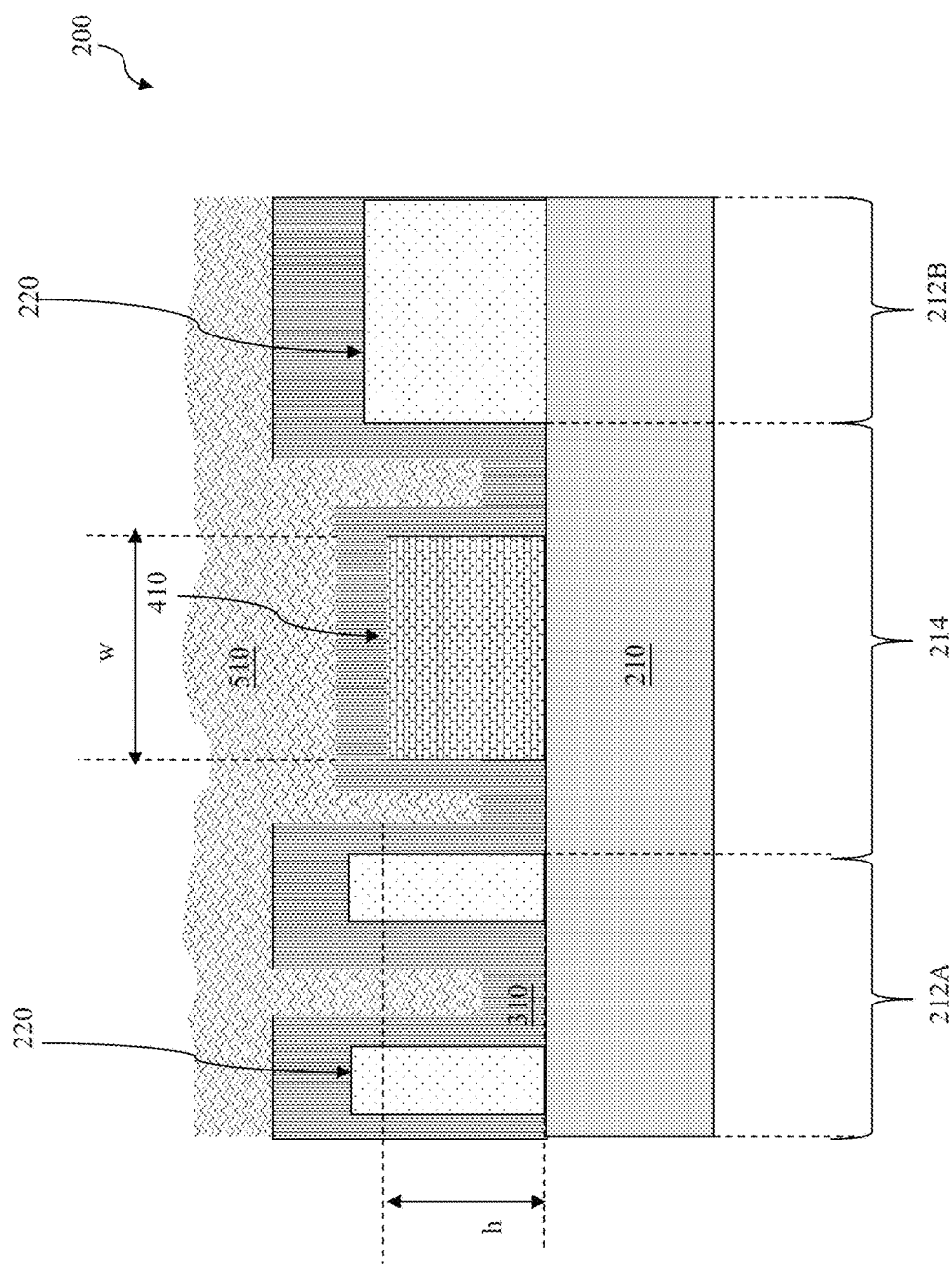

Referring to FIGS. 26 and 29, method 2000 proceeds to step 2008 by forming the FM layer 510 over the material layer 310. The step 2008 is similar to those discussed above in step 110. Thus, the discussion above with respect to step 110 is applicable to step 2008.

Figure 30:
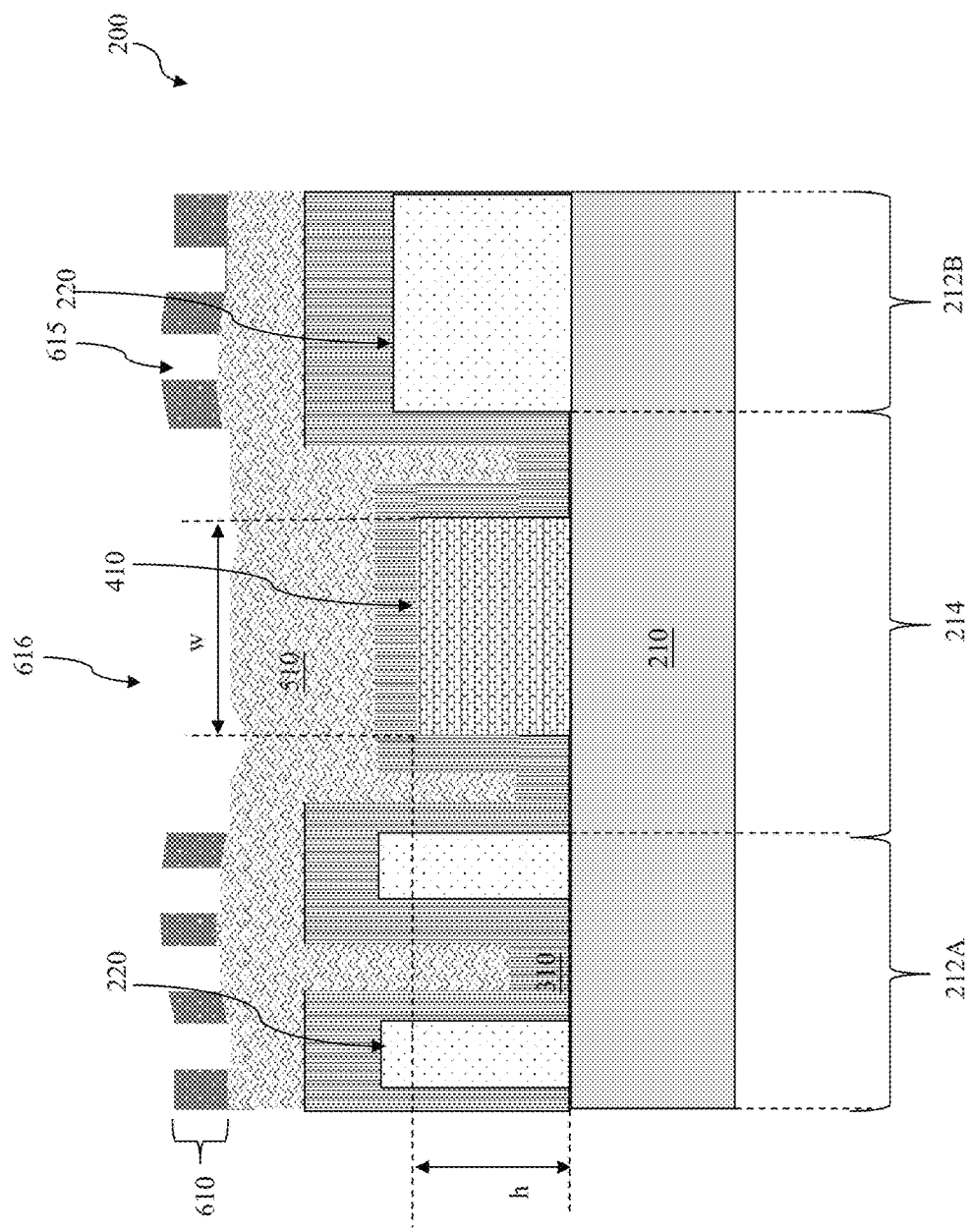

Referring to FIGS. 26 and 30, method 2000 proceeds to step 2010 by forming the patterned HM 610 is over the FM layer 510. The step 2010 is similar to those discussed above in step 112. Thus, the discussion above with respect to step 112 is applicable to step 2010.

Figure 31A:
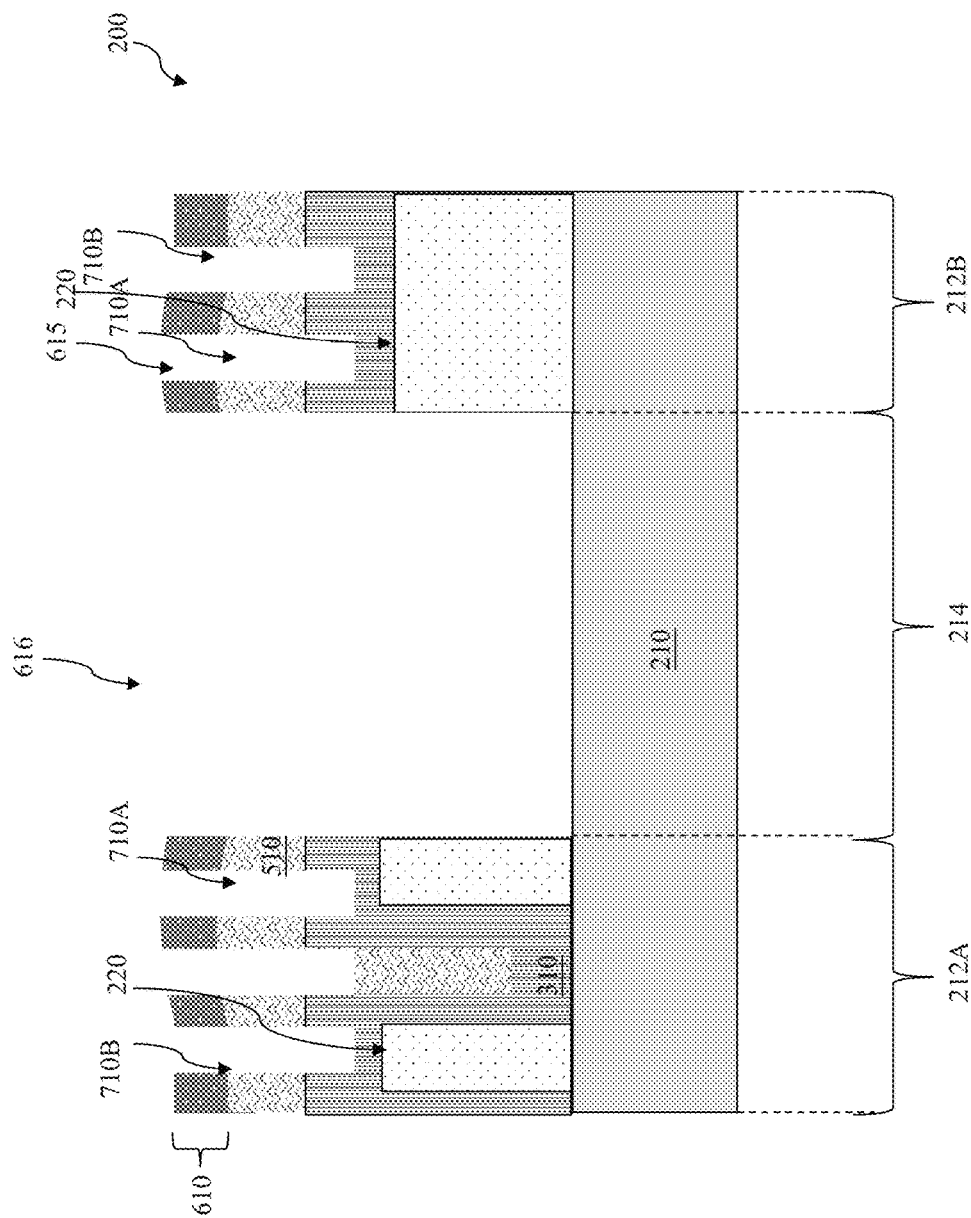

Referring to FIGS. 26 and 31A, method 2000 proceeds to step 2012 by etching the FM layer 510 and the material layer 310 through the first openings 615 to form the trenches 710A and 710B in the material layer 310 and etching the FM layer 510, the material layer 310 and the mandrel feature 410 through the second opening 616 in the second region 214. The step 1012 is similar to those discussed above in step 114. Thus, the discussion above with respect to step 114 is applicable to step 1012.

Figure 31B:
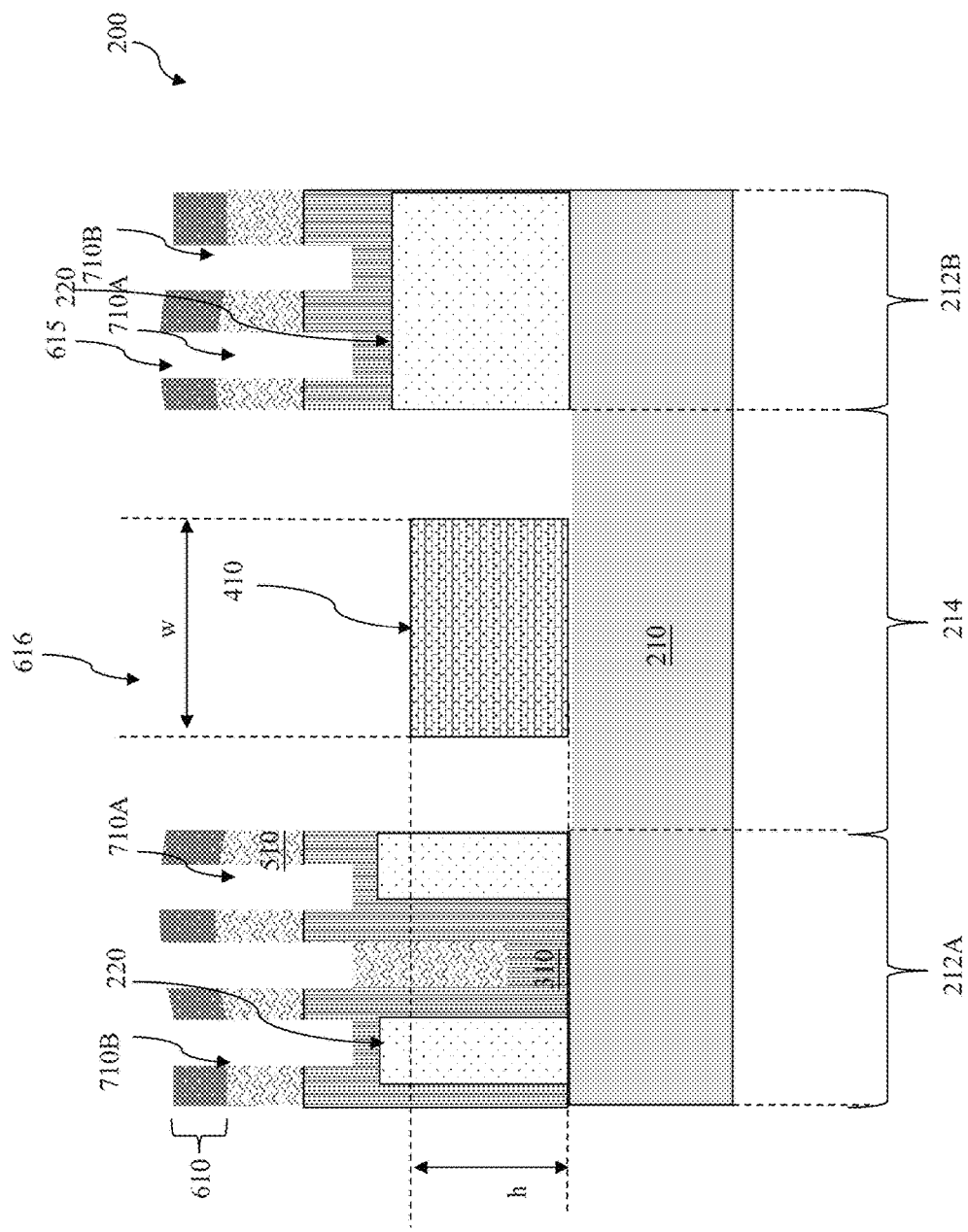

Alternatively, as has been mentioned previously, the etch process is chosen to etch the FM layer 510 and the material layer 310 without etching the mandrel feature 410. Therefore the mandrel feature 410 remains to provide a designate structure for later process integration, as shown in FIG. 31B.

Figure 32A:
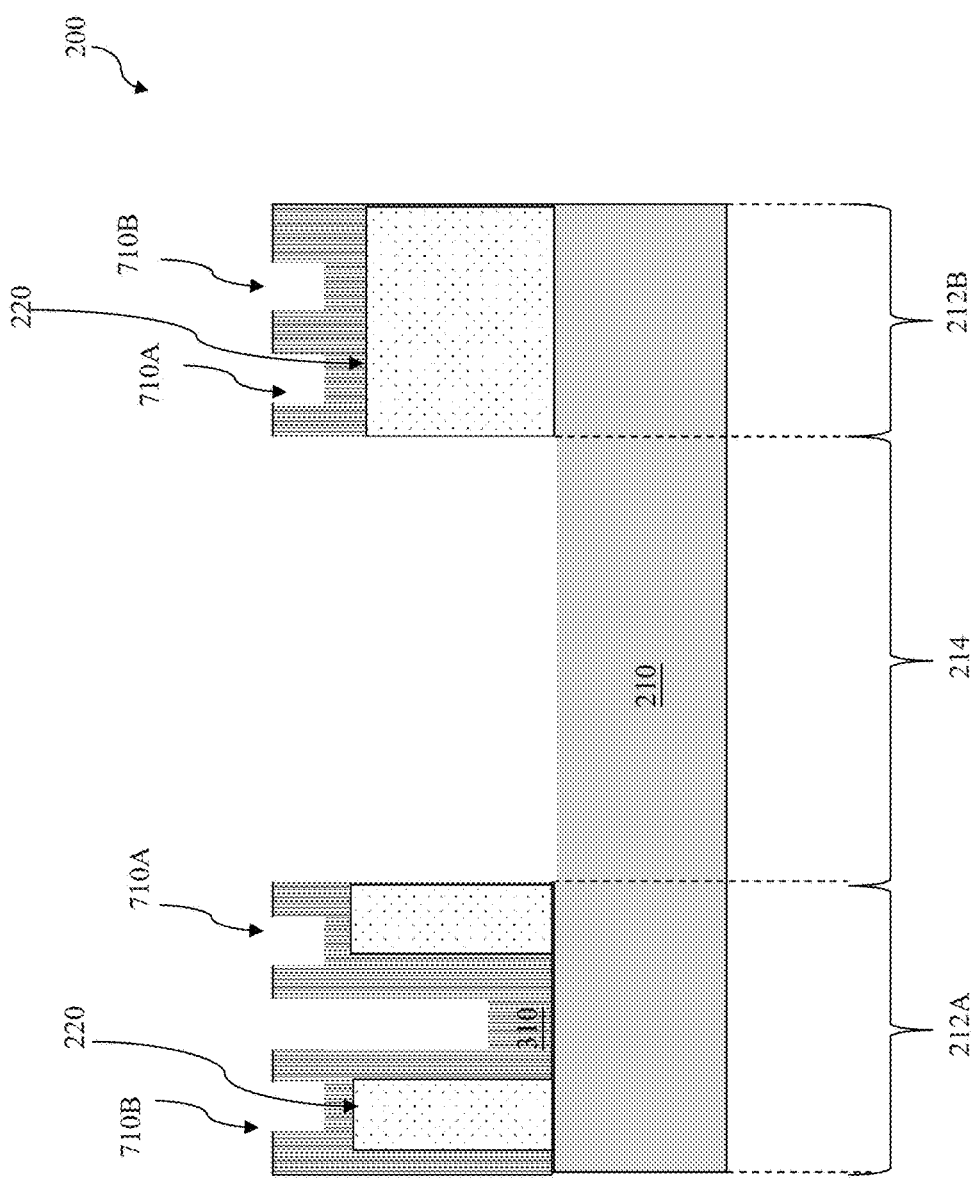
Figure 32B:
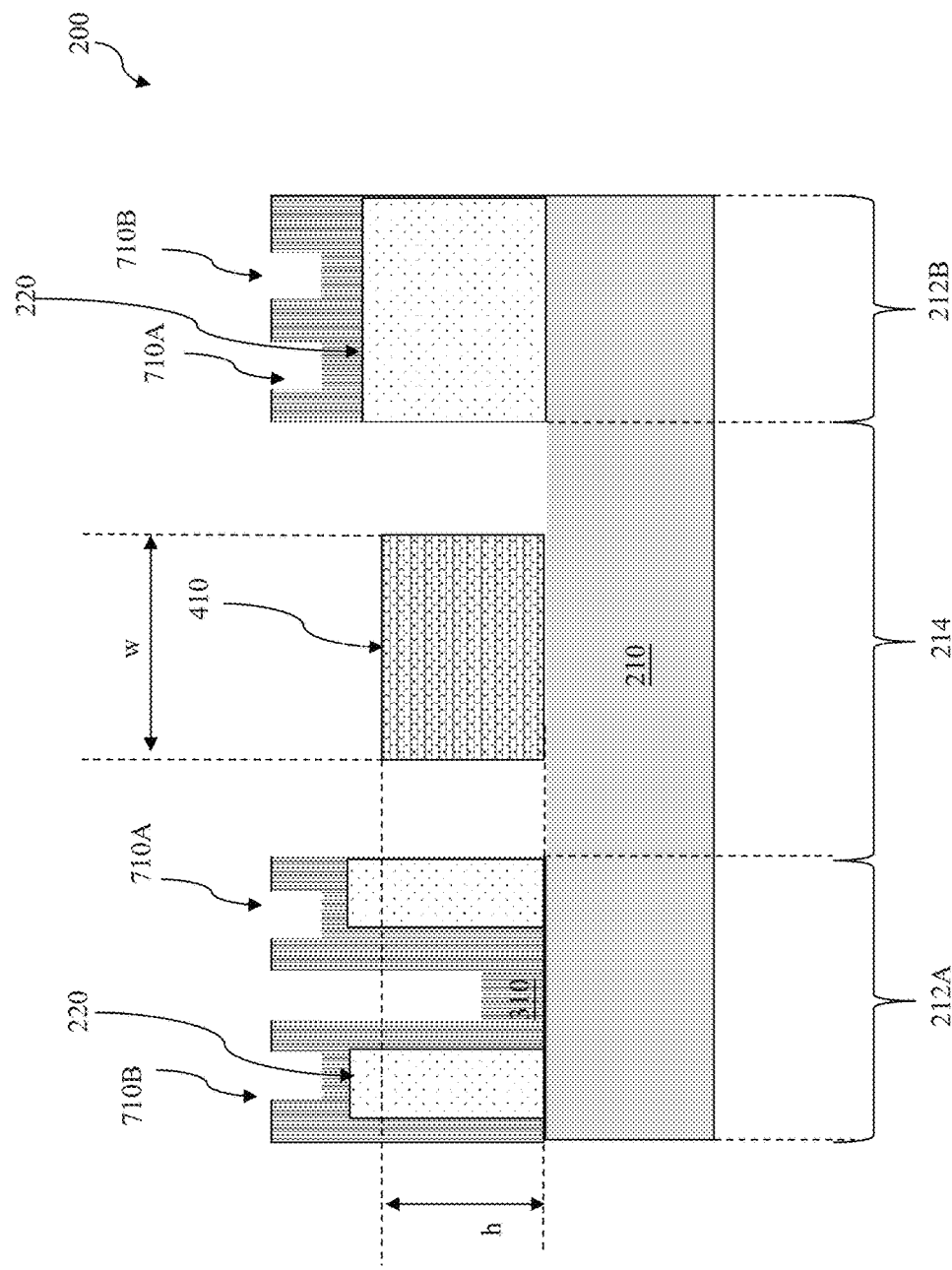

Referring to FIGS. 26, 32A (in conjunction with the process described with respect to FIG. 31A) and 32B (in conjunction with the process described with respect to FIG. 31B), method 2000 proceeds to step 2014 by removing the remaining FM layer 510. The step 2014 is similar to those discussed above in step 116. Thus, the discussion above with respect to step 116 is applicable to step 2014.

Additional steps can be provided before, during, and after the method 2000, and some of the steps described can be replaced or eliminated for other embodiments of the method.

Based on the above, the present disclosure offers structures and methods for improving etch CD uniformity in etching a film which has a topography that is higher than an adjacent region. The method employs forming a mandrel feature in the adjacent region to provide a quite flat topography of a film for in-coming etching process. The method demonstrates a feasible, flexible and low cost planarization method for improving etch CD uniformity.

The present disclosure provides many different embodiments of fabricating a semiconductor device that provide one or more improvements over existing approaches. In one embodiment, a method for fabricating a semiconductor device includes forming a material layer over a first region of a substrate and a second region of the substrate. A top surface of the material layer in the first region is higher than a top surface of the material layer in the second region. The method also includes removing the material layer from the second region, forming a mandrel feature in the second region, forming a flowable-material (FM) layer over the material layer and the mandrel feature and forming a patterned hard mask (HM) over the FM layer, the patterned HM has a plurality of first openings in the first region. The method also includes etching the FM layer and the material layer through the plurality of first openings to form a plurality trenches in the material layer.

In another embodiment, a method includes forming a material layer over a first region of a substrate and a second region of the substrate. A top surface of the material layer in the first region is higher than a top surface of the material layer in the second region. The method also includes forming a mandrel feature over the material layer in the second region, forming a flowable-material (FM) layer over the material layer and the mandrel feature and forming a patterned hard mask (HM) over the FM layer, the patterned HM having a first opening over the first region of the substrate. The method also includes etching the FM layer and the material layer through the first opening to form a trench in the material layer.

In yet another embodiment, a method includes providing a substrate having a plurality of features protruding from the substrate in a first region, forming a mandrel feature in a second region of the substrate, forming a material layer over the plurality of features in the first region and the mandrel feature in the second region, forming a flowable-material (FM) layer over the material layer and forming a patterned hard mask (HM) over the FM layer, the patterned HM having a first opening over the first region of the substrate. The method also includes etching the FM layer and the material layer through the first opening to form a trench in the material layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a patterned layer on a substrate having a first region and a second region being adjacent each other, wherein the patterned layer includes first features in the first region, wherein the second region is free of the patterned layer;
    forming a material layer on the patterned layer and the substrate;
    forming a first guard ring disposed in the second region and enclosing the first features, the first guard ring having a height that extends from a top surface of the substrate;
    forming a flowable-material (FM) layer over the material layer and the first guard ring, wherein a portion of the FM layer is constrained within an enclosure of the first guard ring;
    forming a patterned resist layer over the FM layer, wherein the patterned resist layer includes a plurality of openings; and
    transferring the plurality of openings to the material layer.

2. The method of claim 1, wherein the first guard ring is a continuous feature configured to completely enclose the first features in a top view toward the substrate.

3. The method of claim 2, wherein the forming of the FM layer includes:
    disposing a flowable material on the substrate; and
    curing the flowable material to form the FM layer.

4. The method of claim 2, wherein the forming of the first guard ring includes forming the first guard ring that has a width W1 and disposed a distance D1 from the first features, wherein D1 is greater than zero, and wherein W1 is greater than D1.

5. The method of claim 4, wherein the forming of the first guard ring includes forming the first guard ring having a first ratio W1/D1 greater than 5.

6. The method of claim 4, wherein the forming of the first guard ring includes forming the first guard ring having a height Hr substantially equal to a height of the first features.

7. The method of claim 4, further comprising forming a second guard ring disposed in the second region and surrounding the first guard ring.

8. The method of claim 7, wherein the forming of the second guard ring includes forming the second guard ring that has a width W2 and is disposed a distance D2 from the first guard ring, wherein D2 is greater than zero, and wherein W2 is greater than D2.

9. The method of claim 8, wherein the forming of the second guard ring includes forming the second guard ring feature having a second ratio W2/D2 greater than 5, wherein W1 equals W2 and D2 is less than D1.

10. The method of claim 7, wherein the forming of the first guard ring and the forming of the second guard ring feature are implemented simultaneously by a same process including deposition and patterning.

11. A method comprising:
    forming a patterned layer on a substrate having a first region and a second region being adjacent each other, wherein the patterned layer includes first features in the first region, wherein the second region is free of the patterned layer;

forming a first guard ring disposed in the second region and surrounding the first features, the first guard ring having a height that extends from a top surface of the substrate, wherein the first guard ring has a width W1 and is spaced a distance D1 from the first features, wherein D1 is greater than zero, and wherein W1 is greater than D1;

forming a material layer over the patterned layer and over the first guard ring;

forming a patterned resist over the material layer, wherein the patterned resist layer includes a plurality of openings; and transferring the plurality of openings to the material layer.

12. The method of claim 11, further comprising:

disposing a flowable-material (FM) over the material layer before the forming of the patterned resist, wherein a portion of the FM layer is constrained within the enclosure of the first guard ring; and curing the FM to form a cured FM layer, wherein the forming of the patterned resist includes forming the patterned resist layer over the FM layer.

13. The method of claim 11, wherein the forming of the first guard ring includes forming the first guard ring having a first ratio W1/D1 greater than 5.

14. The method of claim 11, wherein the forming of the first guard ring includes forming the first guard ring with a height such that a top surface of the first guard ring is above and a bottom surface of the first guard ring is below a top surface of the first features.

15. The method of claim 11, further comprising forming a second guard ring disposed in the second region and surrounding the first guard ring in a continuous configuration, wherein the forming of the second guard ring includes forming the second guard ring that has a width W2 and is disposed a distance D2 from the first guard ring, wherein D2 is greater than zero, wherein W2 is greater than D2, and wherein D2 is less than D1.

16. A method, comprising:

forming a patterned layer on a substrate having a first region and a second region being adjacent each other, wherein the patterned layer includes first features in the first region, wherein the second region is free of the patterned layer;

forming a first guard ring and a second guard ring both within the second region, wherein the first guard ring surrounds the first features, wherein the second guard ring surrounds the first guard ring, each of the first guard ring and the second guard ring having a height that extends from the top surface of the substrate;

forming a material layer on the patterned layer, the first guard ring, and the second guard ring, wherein the material layer has an uneven topography;

forming a patterned resist over the material layer, wherein the patterned resist layer includes a plurality of openings; and transferring the plurality of openings to the material layer.

17. The method of claim 16, further comprising:

disposing a flowable material (FM) over the material layer before the forming of the patterned resist, wherein the FM is constrained within an enclosure of the first guard ring; and curing the FM to form a cured FM layer, wherein the forming of the patterned resist includes forming the patterned resist layer over the FM layer.

18. The method of claim 16, wherein the forming of the first guard ring and the second guard ring further includes forming a third guard ring disposed in the second region and configured to completely enclose the second guard ring.

19. The method of claim 18, wherein the forming of the first guard ring and the second guard ring includes forming the first guard ring having a first width W1 and a first distance D1 to the patterned layer, wherein D1 is greater than zero;

the second guard ring having a second width W2 and a second distance D2 to the first guard ring, wherein D2 is greater than zero;

the third guard ring having a third width W3 and a third distance D3 to the second guard ring, wherein, wherein D3 is greater than zero, wherein D3 is less than D2 and D2 is less than D1;

W1, W2 and W3 are substantially equal; and a ratio W1/D1 is greater than 5.

20. The method of claim 16, wherein the forming of the first guard ring and the second guard ring includes depositing a material layer including polyimide.

* * * * *